(12) United States Patent
Li et al.

(10) Patent No.: US 9,369,105 B1
(45) Date of Patent: Jun. 14, 2016

(54) METHOD FOR MANUFACTURING A VIBRATING MEMS CIRCUIT

(75) Inventors: Sheng-Shian Li, Yangmei Township (TW); Seungbae Lee, Greensboro, NC (US); Kushal Bhattacharjee, Kernersville, NC (US)

(73) Assignee: RF Micro Devices, Inc., Greensboro, NC (US)

(*) Notice: Subject to any disclaimer, the term of this patent is extended or adjusted under 35 U.S.C. 154(b) by 1439 days.

(21) Appl. No.: 12/202,624

(22) Filed: Sep. 2, 2008

Related U.S. Application Data

(60) Provisional application No. 60/969,314, filed on Aug. 31, 2007.

(51) Int. Cl.
*H03H 3/02* (2006.01)
*H01L 41/04* (2006.01)
(Continued)

(52) U.S. Cl.
CPC ............... *H03H 3/02* (2013.01); *H01L 41/047* (2013.01); *H01L 41/053* (2013.01); *H01L 41/29* (2013.01); *H01L 41/311* (2013.01); *H03H 9/0207* (2013.01); *H03H 9/02062* (2013.01); *H03H 9/0542* (2013.01); *H03H 9/0547* (2013.01);
(Continued)

(58) Field of Classification Search
CPC ... H03H 3/02; H03H 9/02062; H03H 9/0207; H03H 9/0542; H03H 9/0547; H03H 2009/02283; H03H 2009/02299; H03H 2009/155; H01L 41/047; H01L 41/053; H01L 41/29; H01L 41/311; Y10T 29/42; Y10T 29/49005; Y10T 29/49147; Y10T 29/49155

USPC ......... 29/25.35, 842, 846, 594; 252/62.9 PZ; 310/349, 351, 353, 363, 364, 366
See application file for complete search history.

(56) References Cited

U.S. PATENT DOCUMENTS

| 4,798,989 A | 1/1989 | Miyazaki et al. |
| 5,739,624 A | 4/1998 | Kleiman |

(Continued)

FOREIGN PATENT DOCUMENTS

| JP | 57078206 A | * | 5/1982 | .................. 29/25.35 |
| JP | 58095690 A | * | 6/1983 | |
| WO | WO 03042687 A1 | * | 5/2003 | |

OTHER PUBLICATIONS

Aigner, R. et al., "Advancement of MEMS into RF-Filter Applications," Electron devices (San Francisco CA, Dec. 8-11, 2002, technical digest), 2002, pp. 897-900, IEDM: International Electron Devices Meeting, San Francisco CA.

(Continued)

*Primary Examiner* — A. Dexter Tugbang
(74) *Attorney, Agent, or Firm* — Withrow & Terranova, P.L.L.C.

(57) ABSTRACT

A method for making a micro-electro-mechanical systems (MEMS) vibrating structure is disclosed. The MEMS is supported by a MEMS anchor system and includes a single-crystal piezoelectric thin-film layer that has a specific non-standard crystal orientation, which may be selected to increase an electromechanical coupling coefficient, decrease a temperature coefficient of frequency, or both. The MEMS vibrating structure may have dominant lateral vibrations or dominant thickness vibrations. The single-crystal piezoelectric thin-film layer may include Lithium Tantalate or Lithium Niobate, and may provide MEMS vibrating structures with precise sizes and shapes, which may provide high accuracy and enable fabrication of multiple resonators having different resonant frequencies on a single substrate.

19 Claims, 19 Drawing Sheets

(51) Int. Cl.

| | |
|---|---|
| *H03H 9/02* | (2006.01) |
| *H03H 9/05* | (2006.01) |
| *H01L 41/047* | (2006.01) |
| *H01L 41/053* | (2006.01) |
| *H01L 41/29* | (2013.01) |
| *H01L 41/311* | (2013.01) |
| *H03H 9/15* | (2006.01) |

(52) U.S. Cl.
CPC ............... *H03H 2009/02283* (2013.01); *H03H 2009/02299* (2013.01); *H03H 2009/155* (2013.01); *Y10T 29/42* (2015.01); *Y10T 29/49005* (2015.01); *Y10T 29/49147* (2015.01); *Y10T 29/49155* (2015.01)

(56) References Cited

U.S. PATENT DOCUMENTS

| | | | |
|---|---|---|---|
| 6,249,073 | B1 | 6/2001 | Nguyen et al. |
| 6,336,366 | B1 | 1/2002 | Thundat et al. |
| 6,349,454 | B1* | 2/2002 | Manfra et al. ............... 29/25.35 |
| 6,437,486 | B1 | 8/2002 | Burcsu et al. |
| 6,767,749 | B2 | 7/2004 | Kub et al. |
| 6,909,221 | B2 | 6/2005 | Ayazi et al. |
| 7,250,705 | B2 | 7/2007 | Dewa et al. |
| 7,315,107 | B2 | 1/2008 | Kando et al. |
| 7,492,241 | B2 | 2/2009 | Piazza et al. |
| 7,586,239 | B1 | 9/2009 | Li et al. |
| 7,626,846 | B2 | 12/2009 | Rao et al. |
| 7,639,105 | B2 | 12/2009 | Ayazi et al. |
| 7,750,759 | B1 | 7/2010 | Lee et al. |
| 7,898,158 | B1 | 3/2011 | Li et al. |
| 8,035,280 | B2 | 10/2011 | Li et al. |
| 8,508,108 | B2 | 8/2013 | Anand et al. |
| 9,117,593 | B2 | 8/2015 | Bhattacharjee |
| 2003/0006676 | A1 | 1/2003 | Smith et al. |
| 2003/0119220 | A1 | 6/2003 | Mlcak et al. |
| 2004/0125472 | A1 | 7/2004 | Belt |
| 2005/0035687 | A1 | 2/2005 | Xu et al. |
| 2005/0184627 | A1* | 8/2005 | Sano et al. ................... 310/363 |
| 2006/0082256 | A1 | 4/2006 | Bibl et al. |
| 2006/0131997 | A1 | 6/2006 | Kim et al. |
| 2007/0200458 | A1 | 8/2007 | Yoshino et al. |
| 2007/0209176 | A1 | 9/2007 | Kawakubo et al. |
| 2007/0228887 | A1 | 10/2007 | Nishigaki et al. |
| 2007/0284971 | A1 | 12/2007 | Sano et al. |
| 2010/0194499 | A1 | 8/2010 | Wang et al. |
| 2010/0237709 | A1 | 9/2010 | Hall et al. |
| 2011/0181150 | A1 | 7/2011 | Mahameed et al. |
| 2014/0125201 | A1 | 5/2014 | Bhattacharjee |
| 2014/0183669 | A1 | 7/2014 | Xu et al. |
| 2014/0210314 | A1 | 7/2014 | Bhattacharjee et al. |
| 2014/0210315 | A1 | 7/2014 | Bhattacharjee et al. |

OTHER PUBLICATIONS

Aigner, Robert et al., "Bulk-Acoustic-Wave Filters: Performance Optimization and Volume Manufacturing," IEEE MTT-S Digest, 2003, pp. 2001-2004, IEEE.

Bannon, III, Frank D. et al., "High-Q HF Microelectromechanical Filters," IEEE Jounral of Solid-State Circuits, Apr. 2000, pp. 512-526, vol. 35, No. 4, IEEE.

Hannon, John J. et al., "Lithium Tantalate and Lithium Niobate Piezoelectric Resonators in the Medium Frequency Range With Low Ratios of Capacitance and Low Temperature Coefficients of Frequency," IEEE Transactions on Sonics and Ultrasonics, Oct. 1970, pp. 239-246, vol. SU-17, No. 4, IEEE.

Ho, Gavin K. et al., "High-Order Composite Bulk Acoustic Resonators," IEEE 20th International Conference on Micro Electro Mechanical Systems, 2007, pp. 791-794, IEEE.

Hsu, Wan-Thai et al., "Stiffness Compensated Temperature-Insensitive Micromechanical Resonators," Tech. Digest of the Int. Micro Electro Mechanical Systems Conference, 2002, pp. 731-734.

"IEEE Standard on Piezoelectricity," 1988, ANSI/IEEE Std 176-1987, The Institute of Electrical and Electronics Engineers, Inc, New York, NY.

Iula, Antonio et al., "A Model for the Theoretical Characterization of Thin Piezoceramic Rings," IEEE Transactions on Ultrasonics, Ferroelectrics, and Frequency Control, May 1996, pp. 370-375, vol. 43, No. 3, IEEE.

Kim, Bongsang et al., "Frequency Stability of Wafer-Scale Encapsulated MEMS Resonators," The 13th International Conference on solid-State Sensors, Actuators and Microsystems, Jun. 5-9, 2005, IEEE.

Kovacs, G. et al., "Improved Material Constants for LiNbO3 and LiTaO3," 1990 Ultrasonics Symposium, 1990, pp. 435-438, IEEE.

Li, Sheng-Shian et al., "Micro mechanical 'Hollow-Disk' Ring Resonators," Proceedings of the 17th Int. IEEE Micro Electro Mechanical Systems Conf., Jan. 25-29, 2004, pp. 821-824, IEEE.

Onoe, Morio et al., "Zero Temperature Coefficient of Resonant Frequency in an X-Cut Lithium Tantalate at Room Temperature," Proceedings of the IEEE, 1969, pp. 1446-1448, IEEE.

Osugi, Yukihisa et al., "Single Crystal FBAR with LiNbO3 and LiTaO3 Piezoelectric Substance Layers," IEEE/MTT-S International Microwave Symposium, Jun. 3-8, 2007, pp. 873-876, IEEE.

Piazza, G. et al., "Low Motional Resistance Ring-Shaped Contour-Mode Aluminum Nitride Piezoelectric Micromechanical Resonators for UHF Applications," 18th IEEE International Conference on Micro Electro Mechanical Systems, Jan. 30-Feb. 3, 2005, pp. 20-23, IEEE.

Ruby, R. et al., "PCS 1900 MHz Duplexer Using Thin Film Bulk Acoustic Resonators (FBARs)," Electronics Letters, May 13, 1999, pp. 794-795, vol. 35, No. 10.

Ruby, Richard C. et al., "Thin Film Bulk Wave Acoustic Resonators (FBAR) for Wireless Applications," 2001 IEEE Ultrasonics Symposium, 2001, pp. 813-821, IEEE.

Ruby, Richard et al., "Ultra-Miniature High-Q Filters and Duplexers Using FBAR Technology," 2001 IEEE International Solid-State Circuits Conference, Feb. 6, 2001, Session 7, Technology Directions: Advanced Technologies, 7.5 and Salon 1-6, IEEE.

Sliker, T. R. et al, "Frequency-Temperature Behavior of X-Cut Lithium Tantalate Resonators," Proceedings of the IEEE, Aug. 1968, p. 1402, IEEE.

Smith, R. T. et al., "Temperature Dependence of the Elastic, Piezoelectric, and Dielectric Constants of Lithium Tantalate and Lithium Niobate," Journal of Applied Physica, May 1971, pp. 2219-2230, vol. 42, No. 6, AIP.

"Standards on Piezoelectric Crystals, 1949," Proceedings of the I.R.E., Dec. 1949, pp. 1378-1395, Institute of Radio Engineers.

Stephanou, P. J. et al., "GHz Contour Extensional Mode Aluminum Nitride MEMS Resonators," 2006 IEEE Ultrasonics Symposium, 2006, pp. 2401-2404, IEEE.

Stephanou, P. J. et al., "GHz Higher Order Contour Mode AlN Annular Resonators," IEEE 20th International Conference on Micro Electro Mechanical Systems, Jan. 21-25, 2007, pp. 787-790, IEEE.

Wang, Jing et al., "1.156-GHz Self-Aligned Vibrating Micromechanical Disk Resonator," IEEE Transactions on Ultrasonics, Ferroelectrics, and Frequency Control, Dec. 2004, pp. 1607-1628, vol. 51, No. 12, IEEE.

Warner, A. W. et al, "Low Temperature Coefficient of Frequency in a Lithium Tantalate Resonator," Proceedings of the IEEE, Mar. 1967, p. 450, IEEE.

Weisstein, Eric W., "Euler Angles," from MathWorld—A Wolfram Web Resource, http://mathworld.wolfram.com/EulerAngles.html.

Kadota, Michio et al., "High Frequency Lamb Wave Resonator using LiNbO3 Crystal Thin Plate and Application to Tunable Filter," 2010 IEEE International Ultrasonics Symposium Proceedings, 2010, pp. 962-965, Oct. 14, 2010.

Author Unknown, "Soitec Innovative Process for Materials Treatments—SMART CUT(R)," Soitec, Retrieved: Apr. 20, 2010, 1 page, www.soitec.com.

Bassignot, F. et al., "A new acoustic resonator concept based on acoustic waveguides using silicon/periodically poled transducer/silicon structures for RF applications," 2011 Joint Conference of the IEEE International Frequency Control and the European Frequency and Time Forum (FCS), 6 pages.

(56) References Cited

OTHER PUBLICATIONS

Batchko, Robert G. et al., "Backswitch Poling in Lithium Niobate for High-Fidelity Domain Patterning and Efficient Blue Light Generation," Applied Physics Letters, vol. 75, No. 12, Sep. 20, 1999, pp. 1673-1675.

Brown, Paul T. et al., "Control of Domain Structures in Lithium Tantalate Using Interferometric Optical Patterning," Optics Communications, vol. 163, May 15, 1999, pp. 310-316.

Chandrahalim, Hengky et al., "Channel-Select Micromechanical Filters Using High-K Dielectrically Transduced MEMS Resonators," Proceedings of the 19th International IEEE Micro Electro Mechanical Systems Conference (MEMS 2006), Jan. 22-26, 2006, pp. 894-897, Istanbul, Turkey.

Chen, Yan-Feng et al., "High-Frequency Resonance in Acoustic Superlattice of Periodically Poled LiTaO3," Applied Physics Letters, vol. 70, No. 5, Feb. 3, 1997, pp. 592-594.

Courjon, E. et al., "Periodically Poled Transducers Built on Single Crystal Lithium Niobate Layers Bonded onto Silicon," IEEE Ultrasonics Symposium, 2007, pp. 268-271.

Courjon, E. et al., "Pure Longitudinal Plate Mode Excited by Poled Domains Transducers on LiNbO3," Proceedings, EFTF*IEEE-FCS'07, May 29-Jun. 1, 2007, pp. 1073-1076.

Feld, David et al., "A High Performance 3.0 mm x 3.0 mm x 1.1 mm FBAR Full Band Tx Filter for U.S. PCS Handsets," Proceedings of the 2002 IEEE Ultrasonics Symposium, pp. 913-918.

Kondo, Jungo et al., "High-Speed and Low-Driving-Voltage Thin-Sheet X-Cut LiNbO3 Modulator with Laminated Low-Dielectric-Constant Adhesive," IEEE Photonics Technology Letters, vol. 17, No. 10, Oct. 2005, pp. 2077-2079.

Kumar, A. K. Sarin et al., "High-Frequency Surface Acoustic Wave Device Based on Thin-Film Piezoelectric Interdigital Transducers," Applied Physics Letters, vol. 85, No. 10, Sep. 6, 2004, pp. 1757-1759.

Li, Sheng-Shian et al., "Self-Switching Vibrating Micromechanical Filter Bank," Proceedings of the Joint IEEE Int. Frequency Control/Precision Time & Time Interval Symposium, Aug. 29-31, 2005, pp. 135-141, Vancouver, Canada.

Liu, Xiaoyan et al., "Nanoscale Chemical Etching of Near-Stoichiometric Lithium Tantalate," Journal of Applied Physics, vol. 97, 2005, pp. 064308-1 to 064308-4.

Majjad, H. et al., "Low Temperature Bonding of Interface Acoustic Waves Resonators on Silicon Wafers," Proceedings of the 2005 IEEE Ultrasonics Symposium, 2005, pp. 1307-1310.

Myers, L E. et al., "Quasi-Phase-Matched Optical Parametric Oscillators in Bulk Periodically Poled LiNbO3," J. Opt. Soc. Am. B, vol. 12, No. 11, Nov. 1995, pp. 2102-2116.

Nakamura, Kiyoshi et al., "Local Domain Inversion in Ferroelectric Crystals and Its Application to Piezoelectric Devices," 1989 Ultrasonics Symposium, Copyright: 1989, pp. 309-318.

Ostrovskii, I. V. et al., "Free Vibration of Periodically Poled Ferroelectric Plate," Journal of Applied Physics, vol. 99, No. 114106, 2006, pp. 114106-1 to 114106-6.

Pastureaud, Thomas et al., "High-Frequency Surface Acoustic Waves Excited on Thin-Oriented LiNbO3 Single-Crystal Layers Transferred Onto Silicon," IEEE Transactions on Ultrasonics, Ferroelectrics, and Frequency Control, vol. 54, No. 4, Apr. 2007, pp. 870-876.

Wang, Jing et al., "1.14-GHz Self-Aligned Vibrating Micromechanical Disk Resonator," Technical Digest of the 2003 Radio Frequency Integrated Circuits Symposium, Jun. 8-10, 2003, pp. 335-338, Philadelphia, Pennsylvania.

Wong, Ark-Chew et al., "Micromechanical Mixer-Filters ('Mixlers')," Journal of Microelectromechanical Systems, vol. 13, No. 1, Feb. 2004, pp. 100-112.

Yamada, M. et al., "First-Order Quasi-Phase Matched LiNbO3 Waveguide Periodically Poled by Applying an External Field for Efficient Blue Second-Harmonic Generation," Applied Physics Letters, vol. 62, No. 5 Feb. 1, 1993, pp. 135-436.

Zhu, Yong-Yuan et al., "Crossed Field Excitation of an Acoustic Superlattice," Journal of Physics D: Applied Physics, vol. 29, 1996, pp. 185-187.

Zhu, Yong-Yuan et al., "Ultrasonic Excitation and Propagation in an Acoustic Superlattice," Journal of Applied Physics, vol. 72, No. 3, Aug. 1, 1992, pp. 904-914.

Notice of Allowance for U.S. Appl. No. 12/134,483, mailed Mar. 24, 2009, 6 pages.

Notice of Allowance for U.S. Appl. No. 12/263,883, mailed Oct. 28, 2010, 6 pages.

Notice of Allowance for U.S. Appl. No. 13/037,584, mailed Jun. 9, 2011, 7 pages.

Notice of Allowance for U.S. Appl. No. 14/071,173, mailed Apr. 21, 2015, 8 pages.

Quayle Action for U.S. Appl. No. 14/071,025, mailed Mar. 8, 2016, 6 pages.

Notice of Allowance for U.S. Appl. No. 14/031,383, mailed Mar. 14, 2016, 8 pages.

Notice of Allowance for U.S. Appl. No. 14/031,454, mailed Mar. 4, 2016, 8 pages.

\* cited by examiner

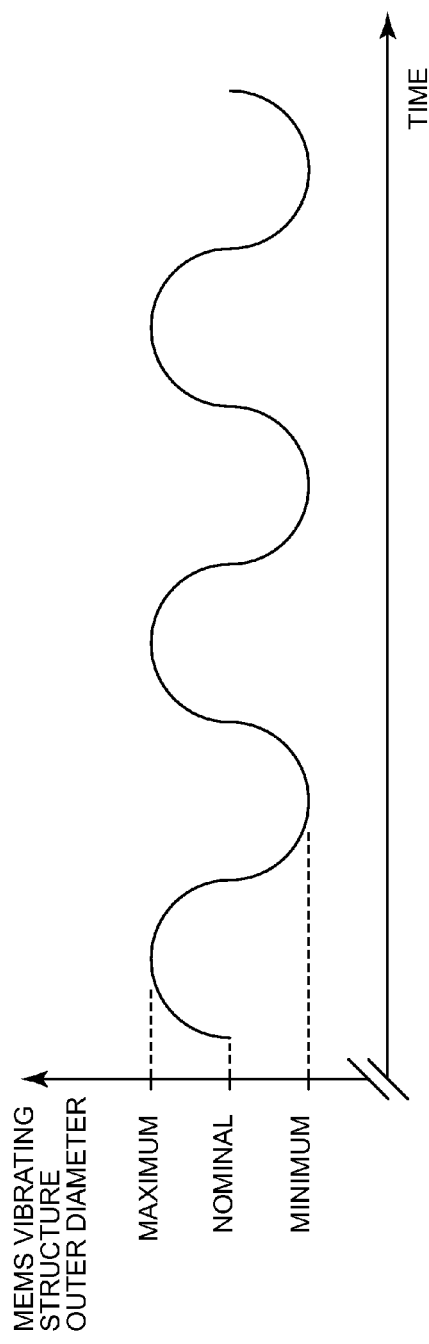
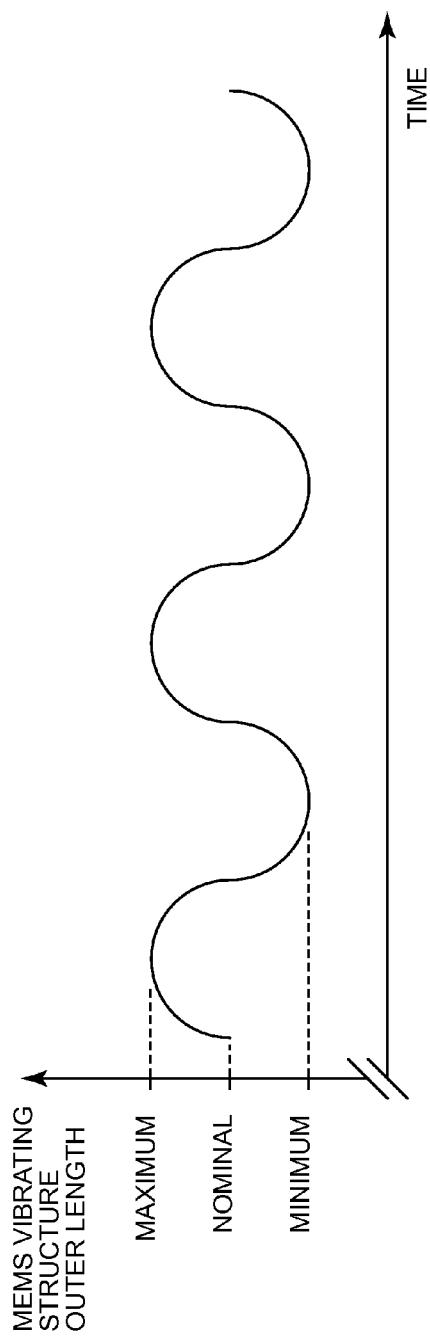

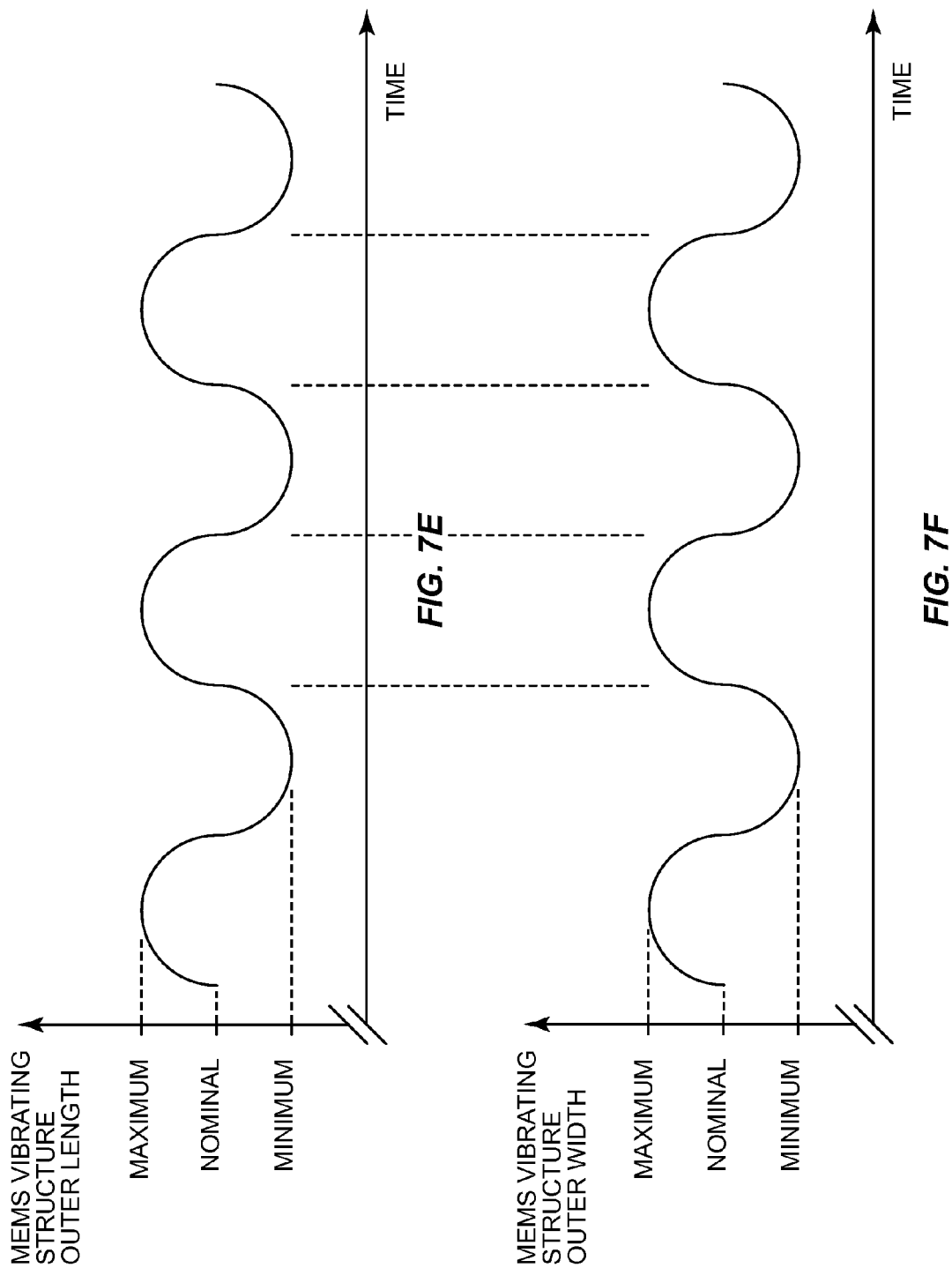

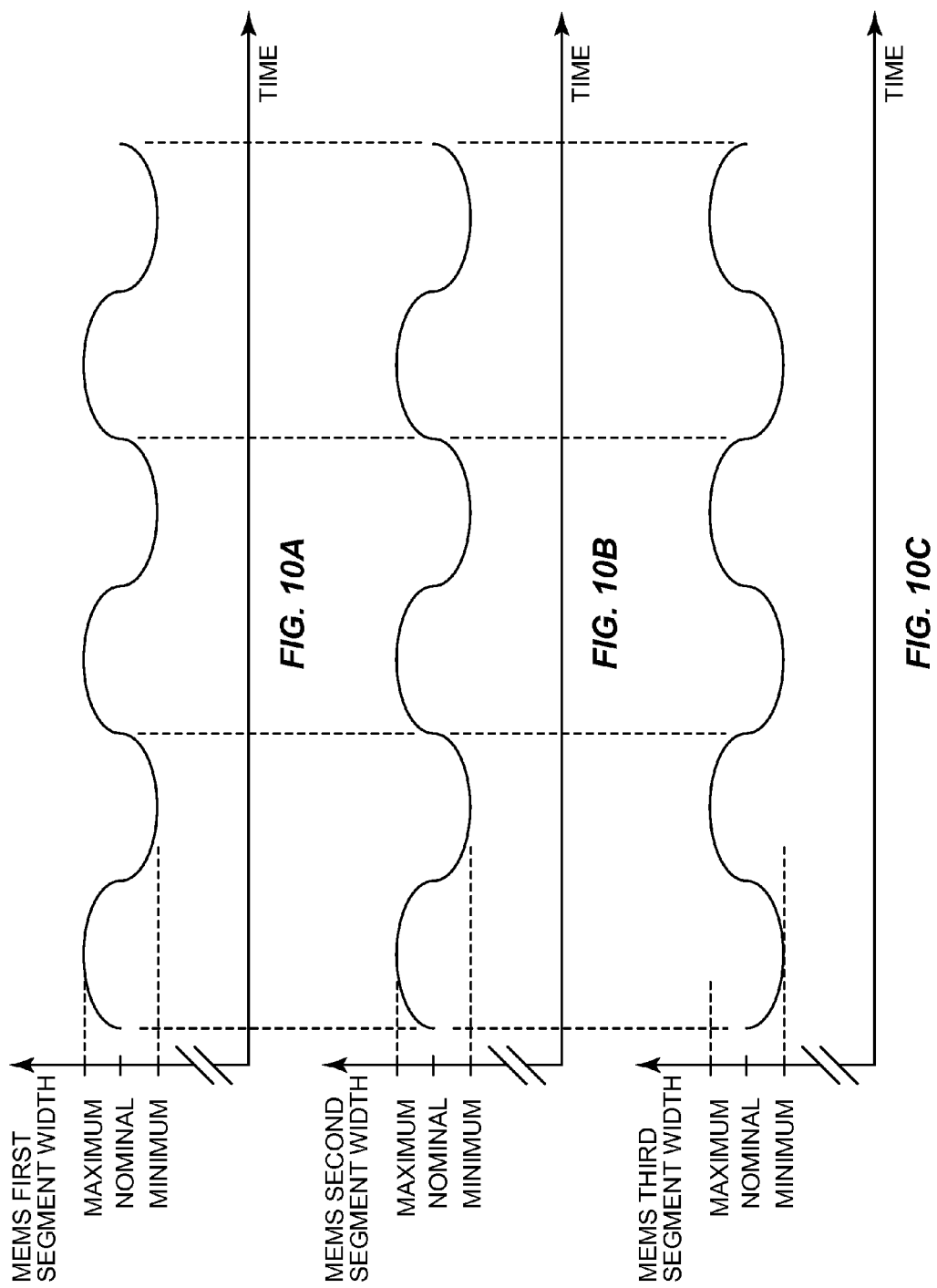

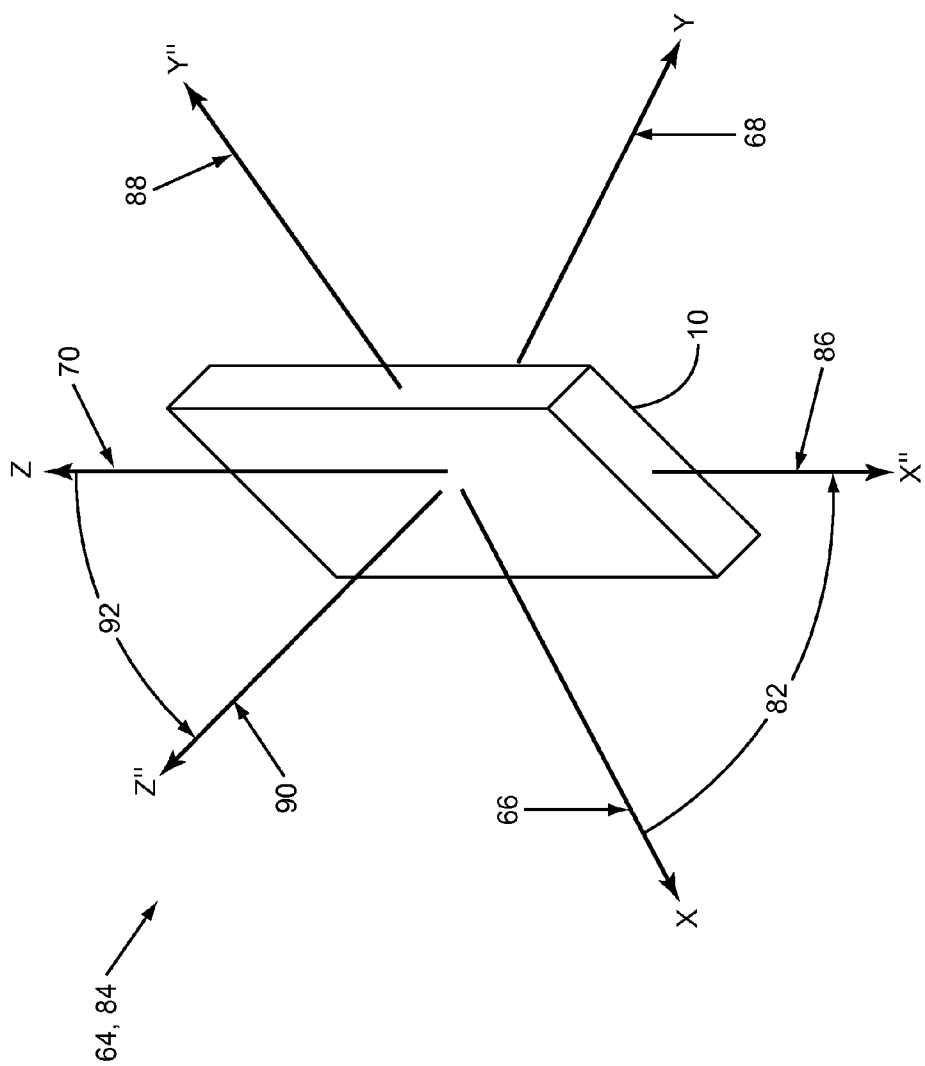

METHOD FOR MANUFACTURING A VIBRATING MEMS CIRCUIT

This application claims the benefit of provisional patent application Ser. No. 60/969,314, filed Aug. 31, 2007, the disclosure of which is hereby incorporated herein by reference in its entirety.

FIELD OF THE INVENTION

Embodiments of the present invention relate to micro-electro-mechanical systems (MEMS) vibrating structures, such as MEMS sensors, MEMS resonators, MEMS oscillators, or MEMS filters, which may be used in radio frequency (RF) communications systems.

BACKGROUND OF THE INVENTION

Resonators are devices that are often used in radio frequency (RF) circuitry in frequency reference circuits and filter circuits. Generally, resonators need to be high-Q, low loss, stable, have a low temperature coefficient of frequency, have high repeatability, have high accuracy, and have a low motional impedance. Additionally, RF circuits often require multiple resonators having different resonant frequencies. In some applications, such as RF filters, resonators need to have a wide bandwidth. Resonators having a high electromechanical coupling coefficient tend to have wide bandwidth.

One common type of resonator is a thin-film bulk acoustic resonator (FBAR), according to the prior art. An FBAR may use a piezoelectric thin-film material surrounded above and below with conductors. Aluminum Nitride may be deposited as a piezoelectric thin-film material; however, the FBAR may predominantly resonate in a thickness mode. Therefore, a resonant frequency of the FBAR may be dependent upon the thickness of a deposited Aluminum Nitride layer, which may be difficult to control. Additionally, a separate Aluminum Nitride layer may be needed for an additional FBAR having a different resonant frequency, which may be limiting or expensive.

An improvement on a traditional FBAR is an FBAR that uses a grown single-crystal FBAR (XBAR), which may have the advantages of good material uniformity, low material defect rates, high material stability, low loss, wide bandwidth, high repeatability, high-Q, and low drift. An alternative to the FBAR is a thin-film piezoelectric-on-substrate resonator (FPOSR), which uses a deposited thin-film, such as Zinc Oxide, on a suspended substrate. The FPOSR may resonate in either a thickness mode or a lateral mode. Lateral vibrations tend to be dependent on the size and shape of the resonator and not dependent upon the thickness of the resonator. However, the deposited thin-film of the FPOSR may have poor frequency stability, high losses, and may have a relatively low electromechanical coupling coefficient due to loading by a substrate layer.

A micro-electro-mechanical systems (MEMS) device includes at least one mechanical element, such as a sensor, an actuator, or a resonator that is formed using a micromachining process that selectively etches away parts of a wafer. The wafer may include added structural layers and may be made of a semiconductor material, such as Silicon. RF communications systems may use MEMS vibrating structures in MEMS resonators or filter circuits. MEMS resonators may be constructed mechanically to provide excellent acoustic isolation between an anchor and a vibrating structure, which may provide MEMS resonators with a very high-Q. Thus, there is a need for a MEMS resonator which is high-Q, low loss, stable, has a low temperature coefficient of frequency, has a high electromechanical coupling coefficient, has high repeatability, has high accuracy, and has a low motional impedance.

SUMMARY OF THE EMBODIMENTS

The present invention relates to a micro-electro-mechanical systems (MEMS) vibrating structure supported by a MEMS anchor system, and includes a single-crystal piezoelectric thin-film layer that has a specific non-standard crystal orientation, which may be selected to increase an electromechanical coupling coefficient, decrease a temperature coefficient of frequency, or both. The MEMS vibrating structure may have dominant lateral vibrations or dominant thickness vibrations. The single-crystal piezoelectric thin-film layer may include Lithium Tantalate or Lithium Niobate, and may provide MEMS vibrating structures with precise sizes and shapes, which may provide high accuracy and enable fabrication of multiple resonators having different resonant frequencies on a single substrate.

Since the MEMS vibrating structure is formed from a single-crystal material and uses mechanically efficient MEMS construction, the MEMS vibrating structure may be high-Q, low loss, stable, have a low temperature coefficient of frequency, have a high electromechanical coupling coefficient, have high repeatability, and have a low motional impedance.

The single-crystal piezoelectric thin-film layer has piezoelectric properties, such that an applied alternating current (AC) voltage may cause mechanical vibrations, and the single-crystal piezoelectric thin-film layer may include Lithium Tantalate or Lithium Niobate for their desirable properties. The single-crystal piezoelectric thin-film layer is sandwiched between two conductive layers, such as metallization layers. The single-crystal piezoelectric thin-film layer is a principal resonating layer and may provide the dominant resonant characteristics of the MEMS vibrating structure.

The single-crystal piezoelectric thin-film layer may be driven with an AC voltage to operate as a piezoelectric transducer, or may additionally be driven with a direct current (DC) voltage to additionally operate as an electrostatic transducer based on the capacitance established by the single-crystal piezoelectric thin-film layer sandwiched between two conductive layers. An electrostatic transducer requires both AC and DC voltages for proper operation.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

Figure 1:
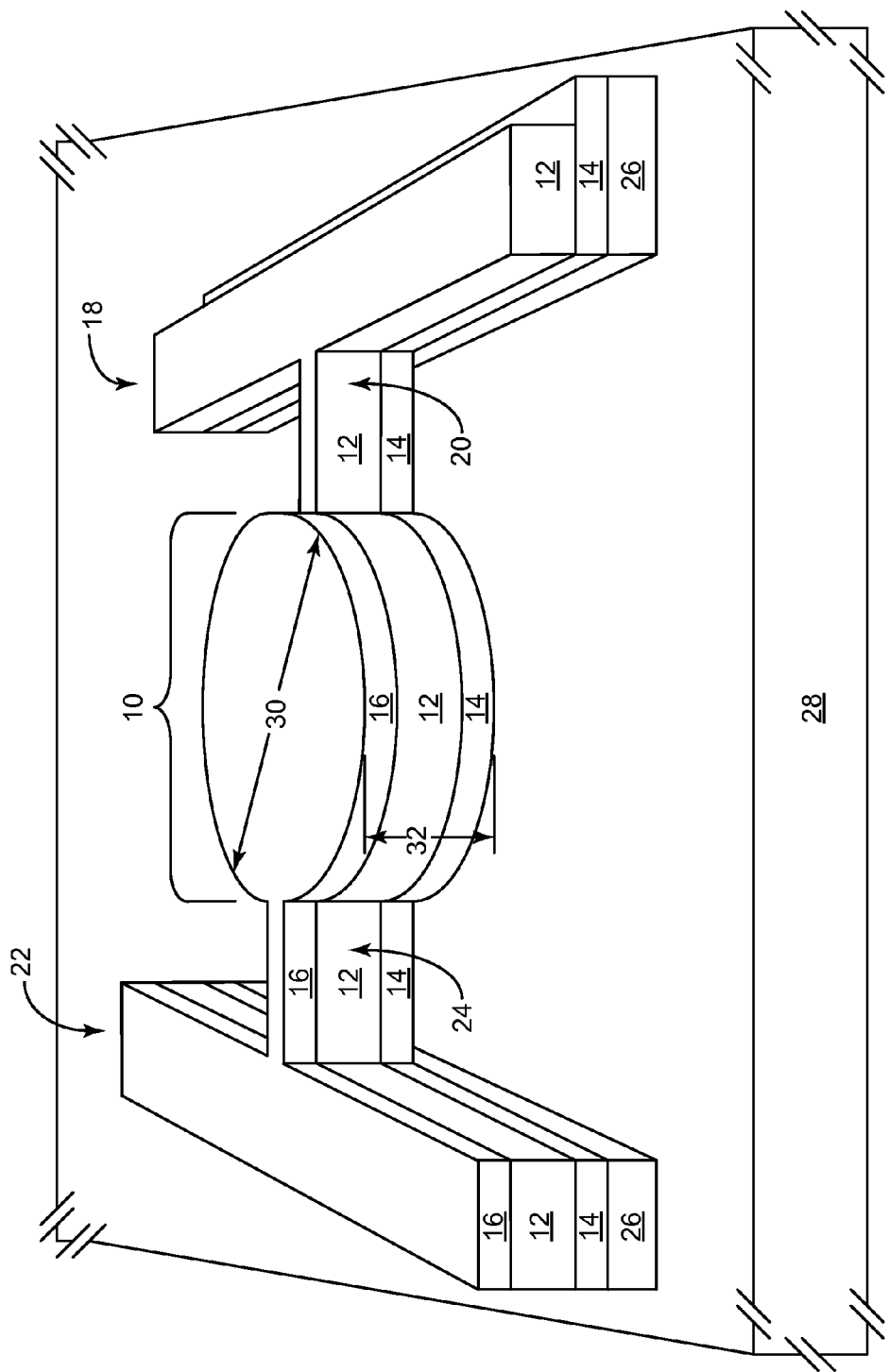
FIG. 1 shows a three-dimensional view of a disk-shaped micro-electro-mechanical systems (MEMS) vibrating structure, according to one embodiment of the present invention.
Figure 4:
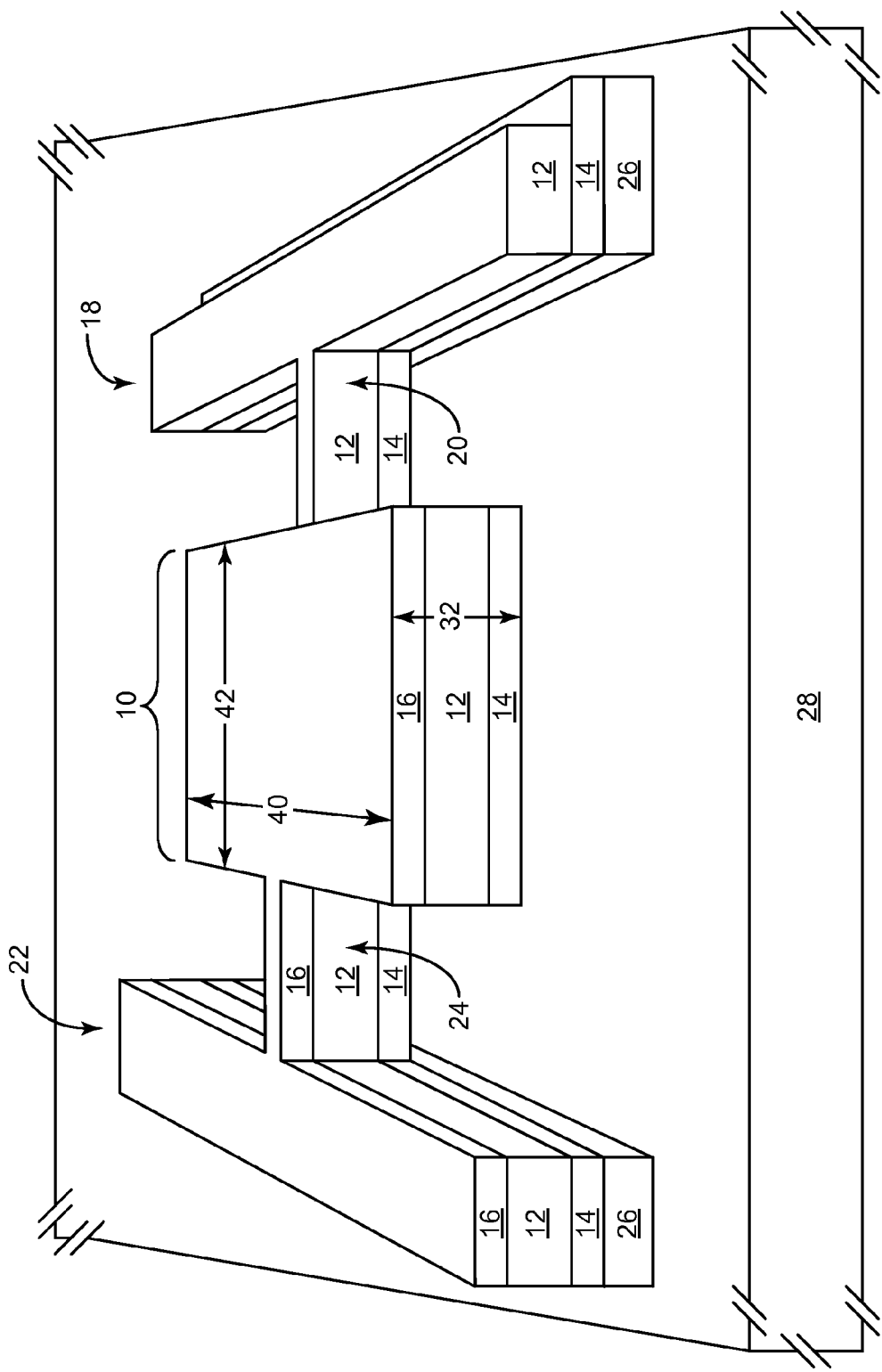
FIG. 4 shows a three-dimensional view of a square-shaped MEMS vibrating structure, according to another embodiment of the present invention.

FIGS. 7A, 7B, 7C, 7D, 7E, and 7F are graphs illustrating how the MEMS vibrating structures illustrated in FIGS. 1 and 4 vary with time.

Figure 8:
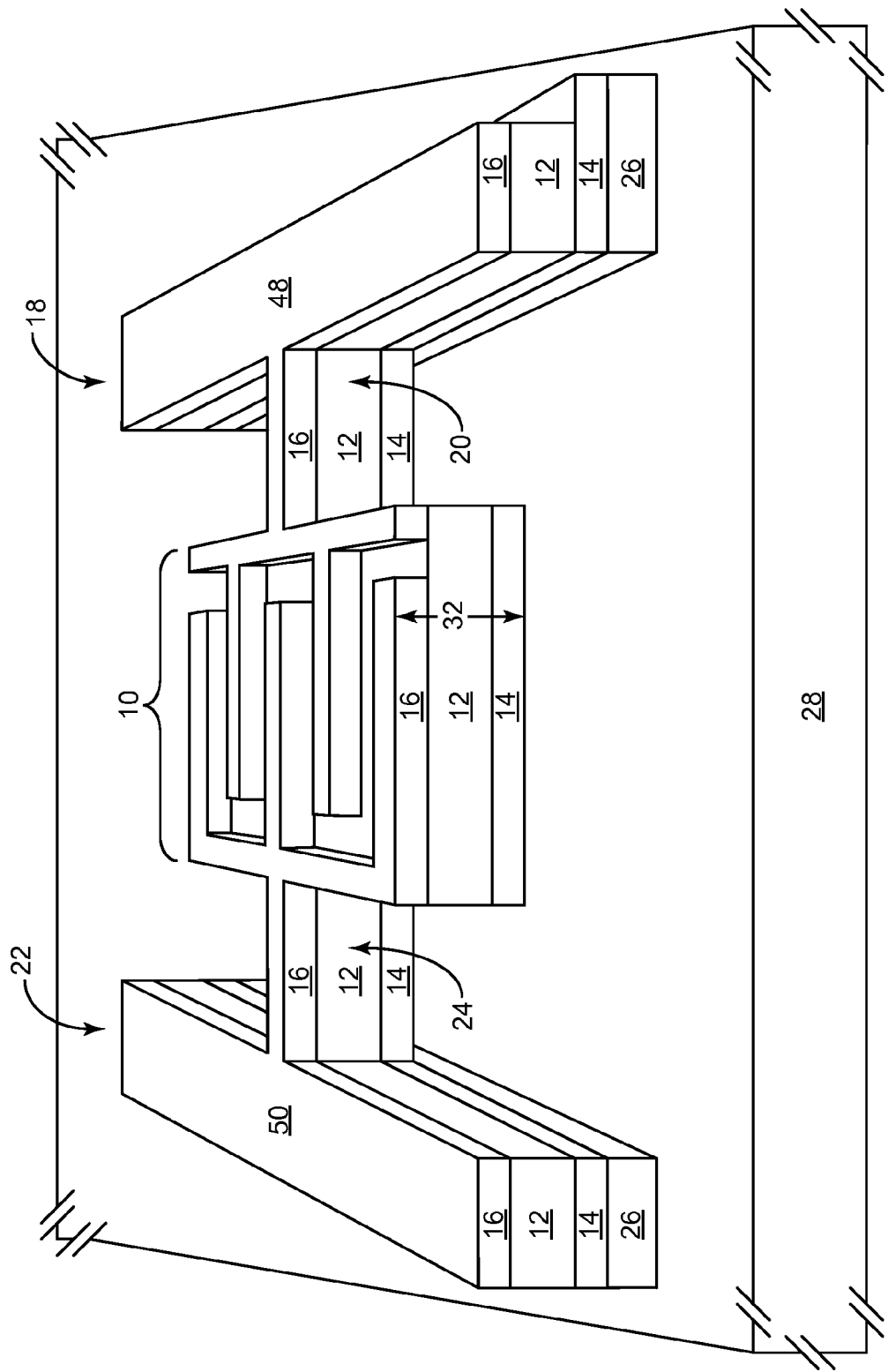

FIG. 8 shows a three-dimensional view of an inter-digital-transduced (IDT) MEMS vibrating structure, according to one embodiment of the present invention.

Figure 9:
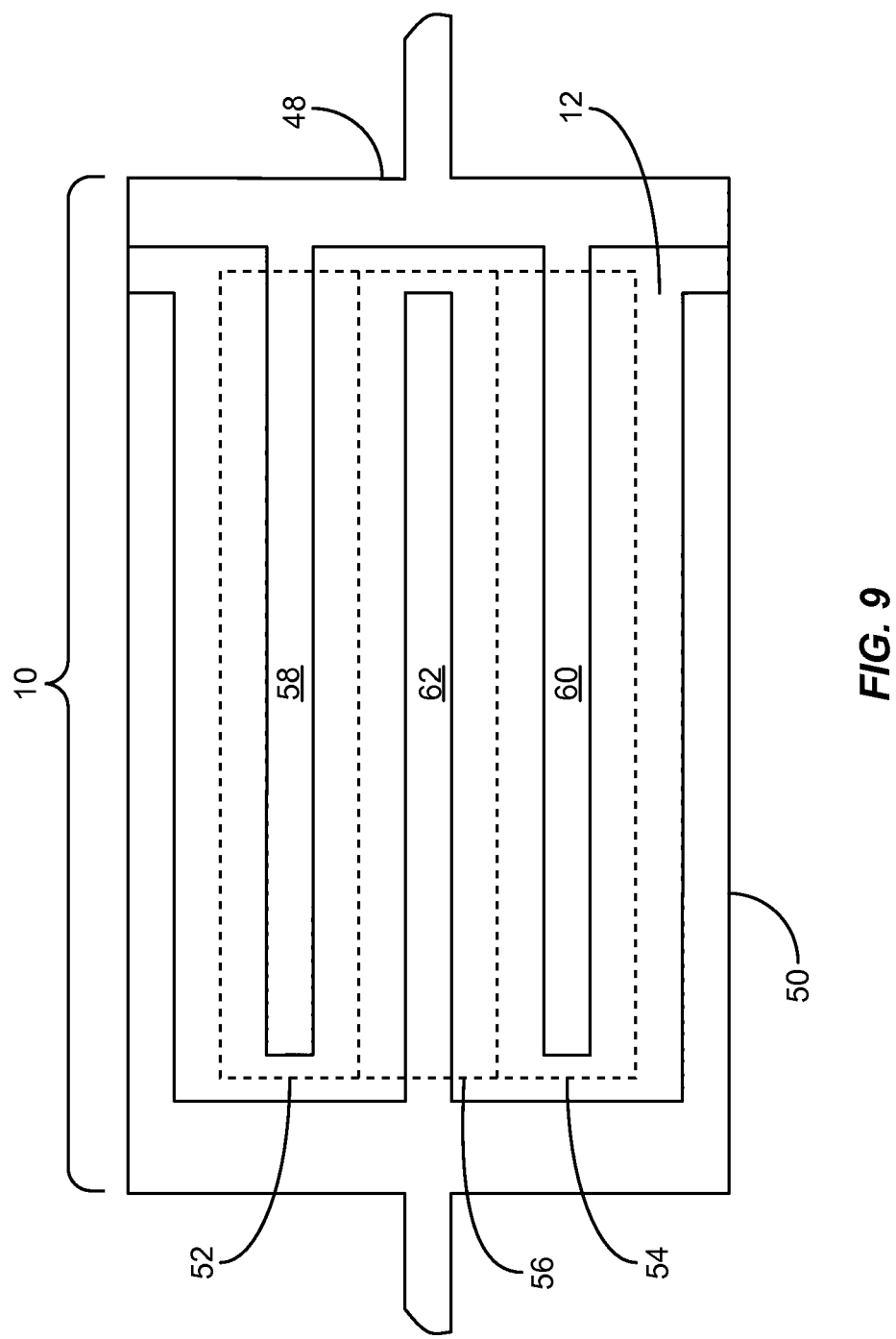

FIG. 9 shows a top view of the IDT MEMS vibrating structure illustrated in FIG. 8.

FIGS. 10A, 10B, and 10C are graphs illustrating how MEMS first, second, and third segment widths vary with time.

FIGS. 11A, 11B, 11C, 11D, 11E, and 11F show Cartesian Coordinate Systems for illustrating orientations of a uniform crystalline structure of a single-crystal piezoelectric thin-film layer relative to the MEMS vibrating structures illustrated in FIGS. 1, 3, 4, 5, 6, 8, and 9.

Figure 12:
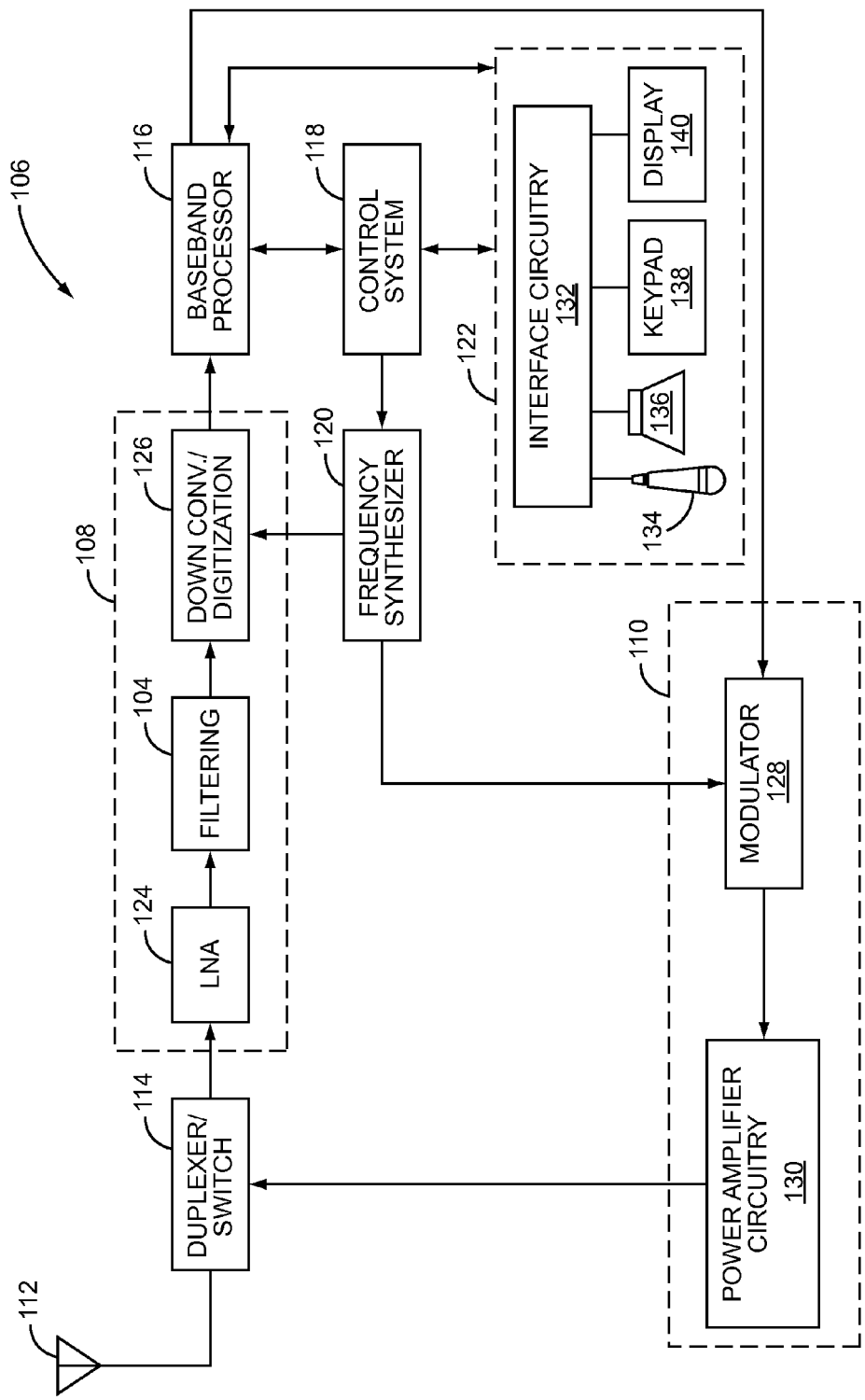

FIG. 12 shows an application example of the present invention used in a mobile terminal.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention relates to a micro-electro-mechanical systems (MEMS) vibrating structure supported by a MEMS anchor system, and includes a single-crystal piezoelectric thin-film layer that has a specific non-standard crystal orientation, which may be selected to increase an electromechanical coupling coefficient, decrease a temperature coefficient of frequency, or both. The MEMS vibrating structure may have dominant lateral vibrations or dominant thickness vibrations. The single-crystal piezoelectric thin-film layer may include Lithium Tantalate or Lithium Niobate, and may provide MEMS vibrating structures with precise sizes and shapes, which may provide high accuracy and enable fabrication of multiple resonators having different resonant frequencies on a single substrate.

Since the MEMS vibrating structure is formed from a single-crystal material and uses mechanically efficient MEMS construction, the MEMS vibrating structure may be high-Q, low loss, stable, have a low temperature coefficient of frequency, have a high electromechanical coupling coefficient, have high repeatability, and have a low motional impedance. In one embodiment of the present invention, a non-standard crystalline orientation of the single-crystal piezoelectric thin-film may be used to provide specific vibrational characteristics, such as a low temperature coefficient of frequency, a high electromechanical coupling coefficient, or both.

The single-crystal piezoelectric thin-film layer has piezoelectric properties, such that an applied alternating current (AC) voltage may cause mechanical vibrations, and the single-crystal piezoelectric thin-film layer may include Lithium Tantalate or Lithium Niobate for their desirable properties. The single-crystal piezoelectric thin-film layer is sandwiched between two conductive layers, such as metallization layers. The single-crystal piezoelectric thin-film layer is a principal resonating layer and may provide the dominant resonant characteristics of the MEMS vibrating structure.

The single-crystal piezoelectric thin-film layer may be driven with an AC voltage to operate as a piezoelectric transducer, or may be additionally driven with a direct current (DC) voltage to operate additionally as an electrostatic transducer based on the capacitance established by the single-crystal piezoelectric thin-film layer sandwiched between two conductive layers. An electrostatic transducer requires both AC and DC voltages for proper operation.

Crystals which acquire a charge when compressed, twisted, or distorted are said to be piezoelectric. This property provides a transducer effect between electrical and mechanical oscillations or vibrations. In a piezoelectric transducer, an applied AC voltage will cause mechanical vibrations in the transducer, which will present an impedance response to the circuitry providing the AC voltage that is dependent on mechanical resonances in the piezoelectric transducer. The impedance response may be called a motional impedance. Additionally, the piezoelectric transducer will present an impedance response, called an electrical impedance, to the circuitry providing the AC voltage that is based on the electrical characteristics of the piezoelectric transducer. The motional impedance and the electrical impedance combine to provide a total impedance presented to the circuitry providing the AC voltage.

An electrostatic transducer is similar to a piezoelectric transducer. In a piezoelectric transducer, charges in a piezoelectric material are produced from mechanical movements in the piezoelectric material. In an electrostatic transducer, charges in a dielectric material, which is enclosed on either side with conducting materials to form a capacitor, are produced from an applied DC voltage across the dielectric material. Mechanical vibrations in the electrostatic transducer will vary the capacitance of the transducer, which will present an impedance response to the circuitry providing the DC voltage across the material that is dependent on mechanical vibrations in the transducer.

If a piezoelectric transducer and an electrostatic transducer are combined into a single transducer using a common crystal material, then the single transducer will have a piezoelectric impedance that is dependent on mechanical and piezoelectric properties of the transducer and the frequency and magnitude of an AC voltage applied across the transducer, and an electrostatic impedance that is dependent on mechanical and electrical properties, such as a dielectric constant, of the transducer and the magnitude of a DC voltage applied across the transducer. The DC voltage may be varied to fine tune the piezoelectric impedance. Additionally, the DC voltage may be modulated with a low frequency signal that is effectively mixed with the AC voltage.

FIG. 1 shows a three-dimensional view of a MEMS vibrating structure 10 according to one embodiment of the present invention. The MEMS vibrating structure 10 includes a single-crystal piezoelectric thin-film layer 12 that is sandwiched between a first conducting layer 14 and a second conducting layer 16. A first supporting structure includes a first anchor 18 and a first mechanical support member 20 between the MEMS vibrating structure 10 and the first anchor 18. A second supporting structure includes a second anchor 22 and a second mechanical support member 24 between the MEMS vibrating structure 10 and the second anchor 22. An insulating layer 26 is located over a substrate 28 and may be etched to provide attachment points for the first and second anchors 18, 22. The first supporting structure includes the first conducting layer 14 and the single-crystal piezoelectric thin-film layer 12. The second supporting structure includes the first and second conducting layers 14, 16 and the single-crystal piezoelectric thin-film layer 12. The MEMS vibrating structure 10 is suspended between the first and second anchors 18, 22. In alternate embodiments of the present invention, the MEMS vibrating structure 10 may be suspended between three or more anchors, or suspended from a single anchor.

The single-crystal piezoelectric thin-film layer 12 may have been cut from a boule that was grown with a specific uniform crystal orientation. The wafer cut, such as a Z-cut, a Y-cut, or any rotated cut, the shape, and the thickness of the single-crystal piezoelectric thin-film layer 12 in the MEMS vibrating structure 10 determine a uniform crystalline orientation of the single-crystal piezoelectric thin-film layer 12 in the MEMS vibrating structure 10, which may determine the vibrational characteristics of the MEMS vibrating structure 10. Additionally, the wafer material, such as Lithium Tantalate or Lithium Niobate, may determine the vibrational characteristics of the MEMS vibrating structure 10. Different vibrational characteristics may be used for different applications, such as resonators, oscillators, filters, or sensors. Historically, a standard uniform crystalline orientation of the single-crystal piezoelectric thin-film layer 12 may have been used as a result of using standard wafer cuts, such as a Z-cut, a Y-cut, or a 45 degree rotated Y-cut. However, in one embodiment of the present invention, a non-standard uniform crystalline orientation of the single-crystal piezoelectric thin-film layer 12 may be used to provide specific vibrational characteristics, such as a low temperature coefficient of frequency, a high electromechanical coupling coefficient, or both.

The non-standard uniform crystalline orientation of the single-crystal piezoelectric thin-film layer 12 may be selected to provide at least one defined characteristic of the MEMS vibrating structure 10. Defined characteristics of the MEMS vibrating structure 10 may include a minimized temperature coefficient of frequency of the MEMS vibrating structure 10, a temperature coefficient of frequency of the MEMS vibrating structure 10 below an acceptance threshold, a maximized electromechanical coupling coefficient of the MEMS vibrating structure 10, an electromechanical coupling coefficient of the MEMS vibrating structure 10 above an acceptance threshold, a maximized electromechanical coupling coefficient of the MEMS vibrating structure 10 to provide a maximized bandwidth of the MEMS vibrating structure 10, an electromechanical coupling coefficient of the MEMS vibrating structure 10 to provide a bandwidth of the MEMS vibrating structure 10 above an acceptance threshold, or any combination thereof.

The maximized bandwidth, the bandwidth above an acceptance threshold, the acceptance threshold, or any combination thereof, may be expressed as an absolute bandwidth, such as kilohertz or megahertz, or as a relative bandwidth, such as a percentage or ratio of an absolute bandwidth divided by a frequency. For example, a MEMS vibrating structure 10 may be used to form a bandpass filter requiring a minimum of a one percent passband; therefore, the acceptance threshold would be one percent. If the bandpass filter had a one gigahertz center frequency, then the bandwidth of the bandpass filter would need to be at least ten megahertz.

One vibrational characteristic is resonant frequency. The single-crystal piezoelectric thin-film layer 12 in the MEMS vibrating structure 10 may have at least one resonant region (not shown) having at least one resonant frequency. Another vibrational characteristic is the electromechanical coupling coefficient, which relates the mechanical characteristics to the electrical characteristics of the MEMS vibrating structure 10, and may be useful for radio frequency (RF) filter applications or high-Q RF circuits. An additional vibrational characteristic is the dominant mode of vibration. In a first embodiment of the MEMS vibrating structure 10, the shape of the MEMS vibrating structure 10 is a disk having an outer diameter 30 and a thickness 32, as illustrated in FIG. 1. The dominant mode of vibration is a contour mode of vibration, which is one form of lateral vibration, wherein the outer diameter 30 varies as the MEMS vibrating structure 10 vibrates.

Figure 2:
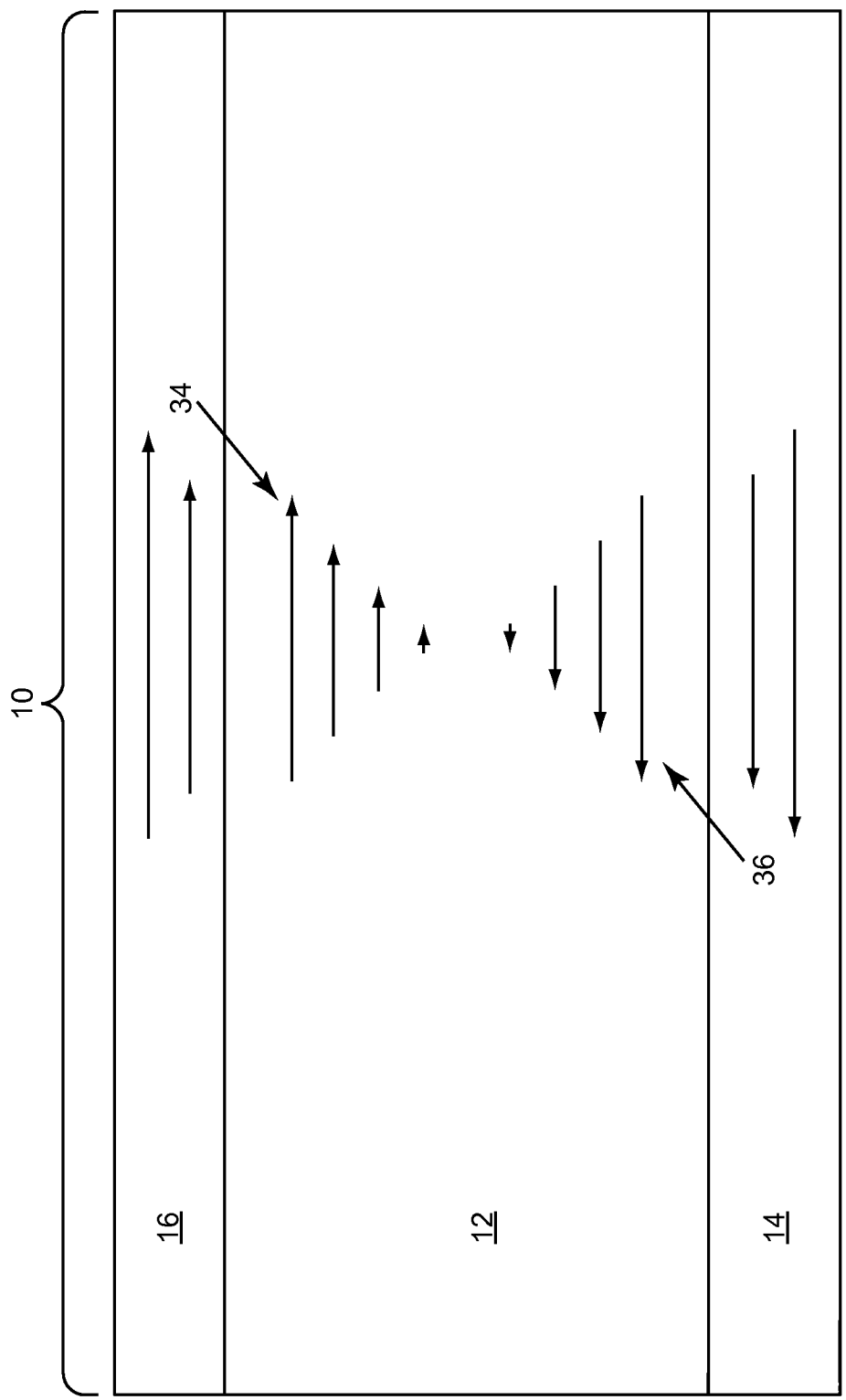
FIG. 2 shows the MEMS vibrating structure vibrating with thickness-shear mode vibrations, according to one embodiment of the present invention.

In a second embodiment of the MEMS vibrating structure 10, the shape of the MEMS vibrating structure 10 is the disk having the outer diameter 30 and the thickness 32, as illustrated in FIG. 1. The dominant mode of vibration is a thickness-extensional mode of vibration, which is one form of thickness vibration, wherein the thickness 32 varies as the MEMS vibrating structure 10 vibrates. In a third embodiment of the MEMS vibrating structure 10, the shape of the MEMS vibrating structure 10 is the disk having the outer diameter 30 and the thickness 32, as illustrated in FIG. 1. The dominant mode of vibration is a thickness-shear mode of vibration, which is one form of thickness vibration, wherein as the MEMS vibrating structure 10 vibrates, the top of the single-crystal piezoelectric thin-film layer 12 in the MEMS vibrating structure 10 moves laterally in one direction 34, while the bottom of the single-crystal piezoelectric thin-film layer 12 moves in an opposite direction 36, as illustrated in FIG. 2.

Figure 3:
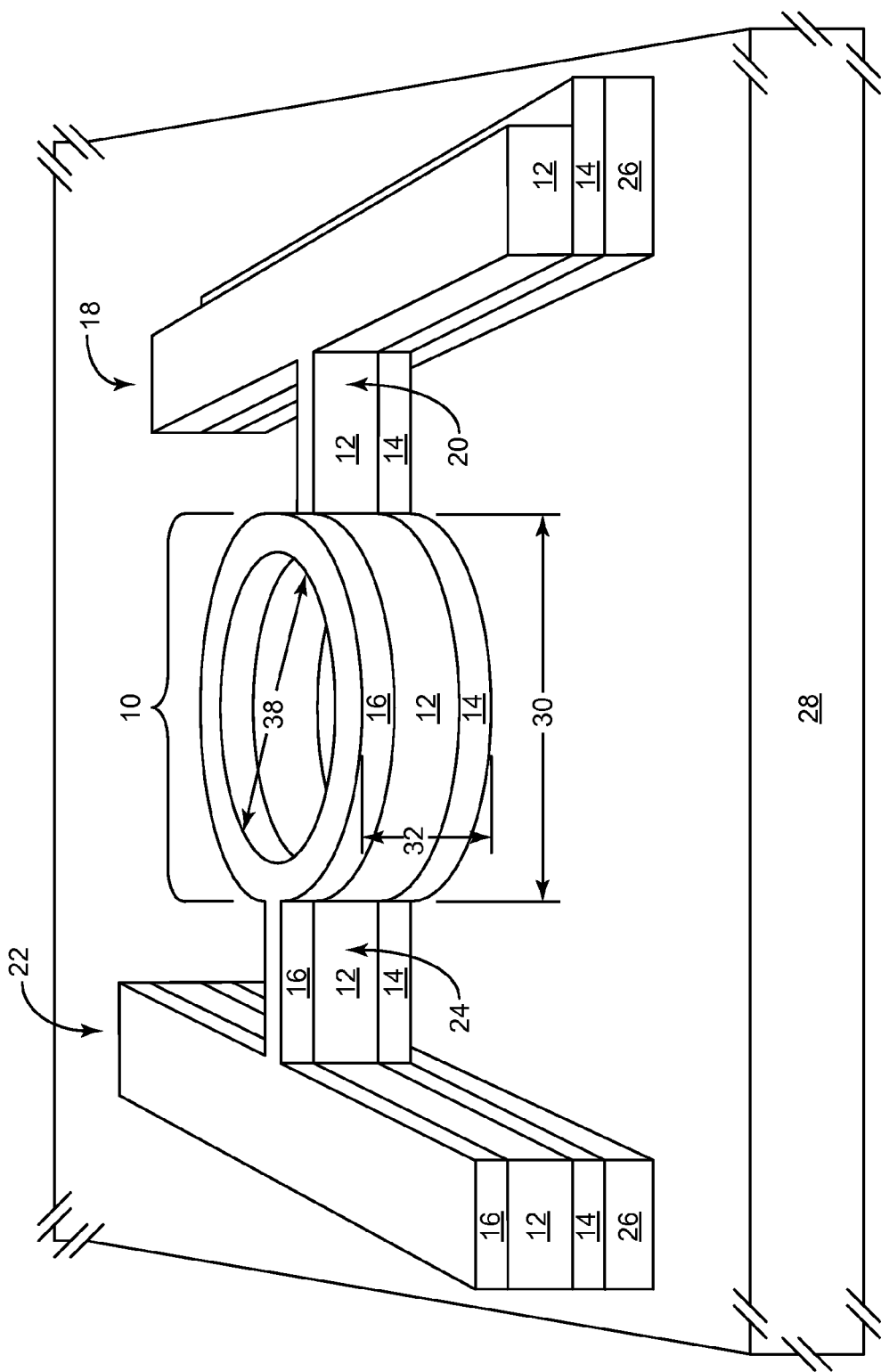
FIG. 3 shows a three-dimensional view of a circular ring-shaped MEMS vibrating structure, according to an alternate embodiment of the present invention.

In a fourth embodiment of the MEMS vibrating structure 10, the shape of the MEMS vibrating structure 10 is a circular ring having the outer diameter 30, an inner diameter 38, and the thickness 32, as illustrated in FIG. 3. The dominant mode of vibration is a contour mode of vibration, which is one form of lateral vibration, wherein the outer diameter 30, the inner diameter 38, or both, vary as the MEMS vibrating structure 10 vibrates.

In a fifth embodiment of the MEMS vibrating structure 10, the shape of the MEMS vibrating structure 10 is the circular ring, as illustrated in FIG. 3. The dominant mode of vibration is a thickness-extensional mode of vibration, which is one form of thickness vibration, wherein the thickness 32 varies as the MEMS vibrating structure 10 vibrates. In a sixth embodiment of the MEMS vibrating structure 10, the shape of the MEMS vibrating structure 10 is the circular ring, as illustrated in FIG. 3. The dominant mode of vibration is a thickness-shear mode of vibration, which is one form of thickness vibration, wherein as the MEMS vibrating structure 10 vibrates, the top of the single-crystal piezoelectric thin-film layer 12 in the MEMS vibrating structure 10 moves laterally in one direction 34, while the bottom of the single-crystal piezoelectric thin-film layer 12 moves in the opposite direction 36, as illustrated in FIG. 2.

In a seventh embodiment of the MEMS vibrating structure 10, the shape of the MEMS vibrating structure 10 is a square having an outer length 40, an outer width 42, and the thickness 32, as illustrated in FIG. 4. The MEMS vibrating structure 10 may be bisected along the outer length 40 of the MEMS vibrating structure 10 by the first and second mechanical support members 20, 24. The outer length 40 may be about equal to the outer width 42. The dominant mode of vibration is a contour mode of vibration, which is one form of lateral vibration, wherein the outer length 40 and the outer width 42 vary as the MEMS vibrating structure 10 vibrates. In an eighth embodiment of the MEMS vibrating structure 10, the shape of the MEMS vibrating structure 10 is the square, as illustrated in FIG. 4. The dominant mode of vibration is a length-extensional mode of vibration, which is one form of lateral vibration, wherein the outer length 40 varies as the MEMS vibrating structure 10 vibrates. In a ninth embodiment of the MEMS vibrating structure 10, the shape of the MEMS vibrating structure 10 is the square, as illustrated in FIG. 4. The dominant mode of vibration is a width-extensional mode of vibration, which is one form of lateral vibration, wherein the outer width 42 varies as the MEMS vibrating structure 10 vibrates.

In a tenth embodiment of the MEMS vibrating structure 10, the shape of the MEMS vibrating structure 10 is the square, as illustrated in FIG. 4. The dominant mode of vibration is a thickness-extensional mode of vibration, which is one form of thickness vibration, wherein the thickness 32 varies as the MEMS vibrating structure 10 vibrates. In an eleventh embodiment of the MEMS vibrating structure 10, the shape of the MEMS vibrating structure 10 is the square, as illustrated in FIG. 4. The dominant mode of vibration is a thickness-shear mode of vibration, which is one form of thickness vibration, wherein as the MEMS vibrating structure 10 vibrates, the top of the single-crystal piezoelectric thin-film layer 12 in the MEMS vibrating structure 10 moves laterally in one direction 34, while the bottom of the single-crystal piezoelectric thin-film layer 12 moves in the opposite direction 36, as illustrated in FIG. 2.

Figure 5:
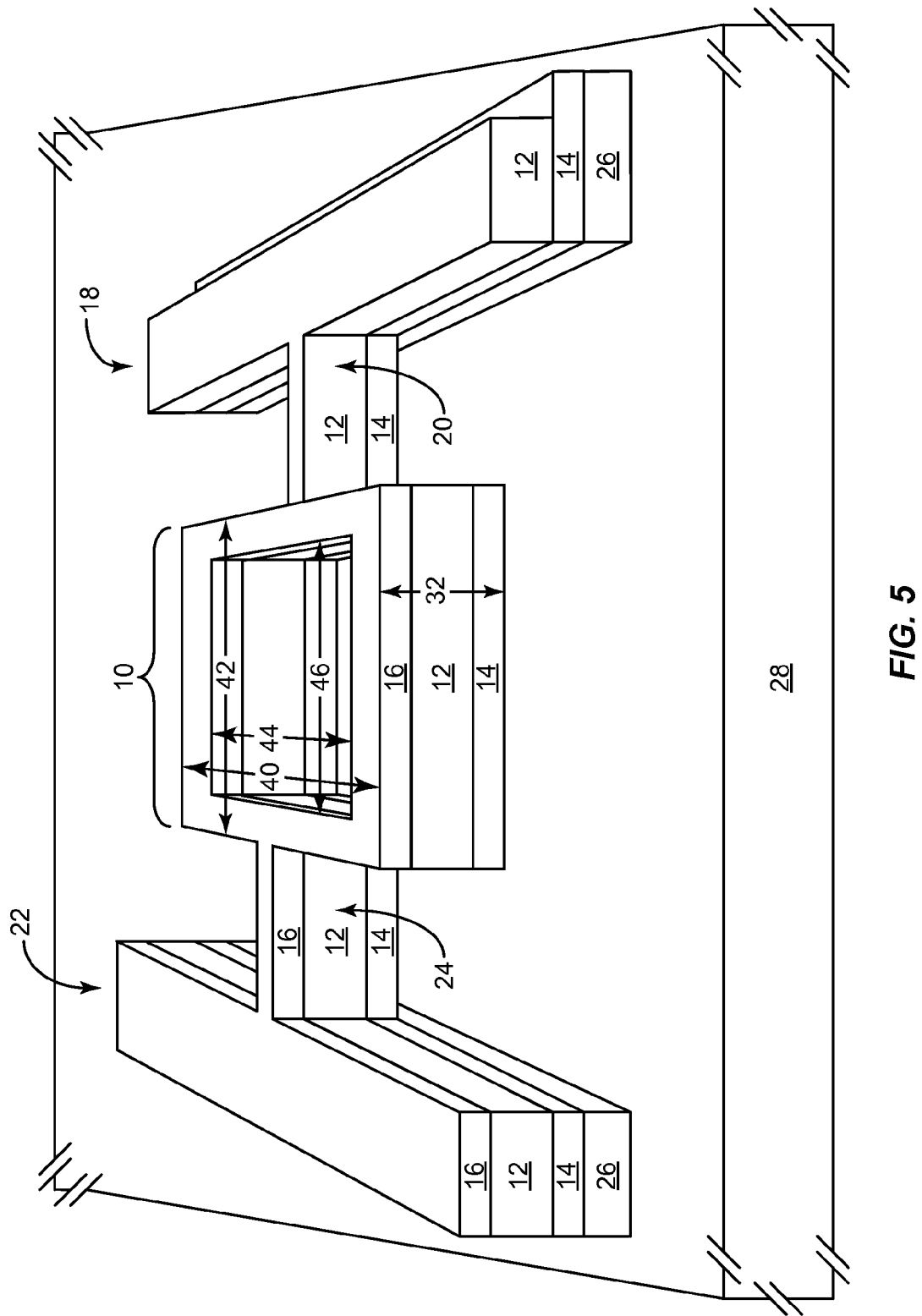
FIG. 5 shows a three-dimensional view of a square ring-shaped MEMS vibrating structure, according to a supplemental embodiment of the present invention.

In a twelfth embodiment of the MEMS vibrating structure 10, the shape of the MEMS vibrating structure 10 is a square ring having the outer length 40, the outer width 42, an inner length 44, an inner width 46, and the thickness 32, as illustrated in FIG. 5. The MEMS vibrating structure 10 may be bisected along the outer length 40 of the MEMS vibrating structure 10 by the first and second mechanical support members 20, 24. The dominant mode of vibration is a contour mode of vibration, which is one form of lateral vibration, wherein the outer length 40, the outer width 42, the inner length 44, the inner width 46, or any combination thereof may vary as the MEMS vibrating structure 10 vibrates.

In a thirteenth embodiment of the MEMS vibrating structure 10, the shape of the MEMS vibrating structure 10 is the square ring, as illustrated in FIG. 5. The dominant mode of vibration is a thickness-extensional mode of vibration, which is one form of thickness vibration, wherein the thickness 32 varies as the MEMS vibrating structure 10 vibrates. In a fourteenth embodiment of the MEMS vibrating structure 10, the shape of the MEMS vibrating structure 10 is the square ring, as illustrated in FIG. 5. The dominant mode of vibration is a thickness-shear mode of vibration, which is one form of thickness vibration, wherein as the MEMS vibrating structure 10 vibrates, the top of the single-crystal piezoelectric thin-film layer 12 in the MEMS vibrating structure 10 moves laterally in one direction 34, while the bottom of the single-crystal piezoelectric thin-film layer 12 moves in the opposite direction 36, as illustrated in FIG. 2.

Figure 6:
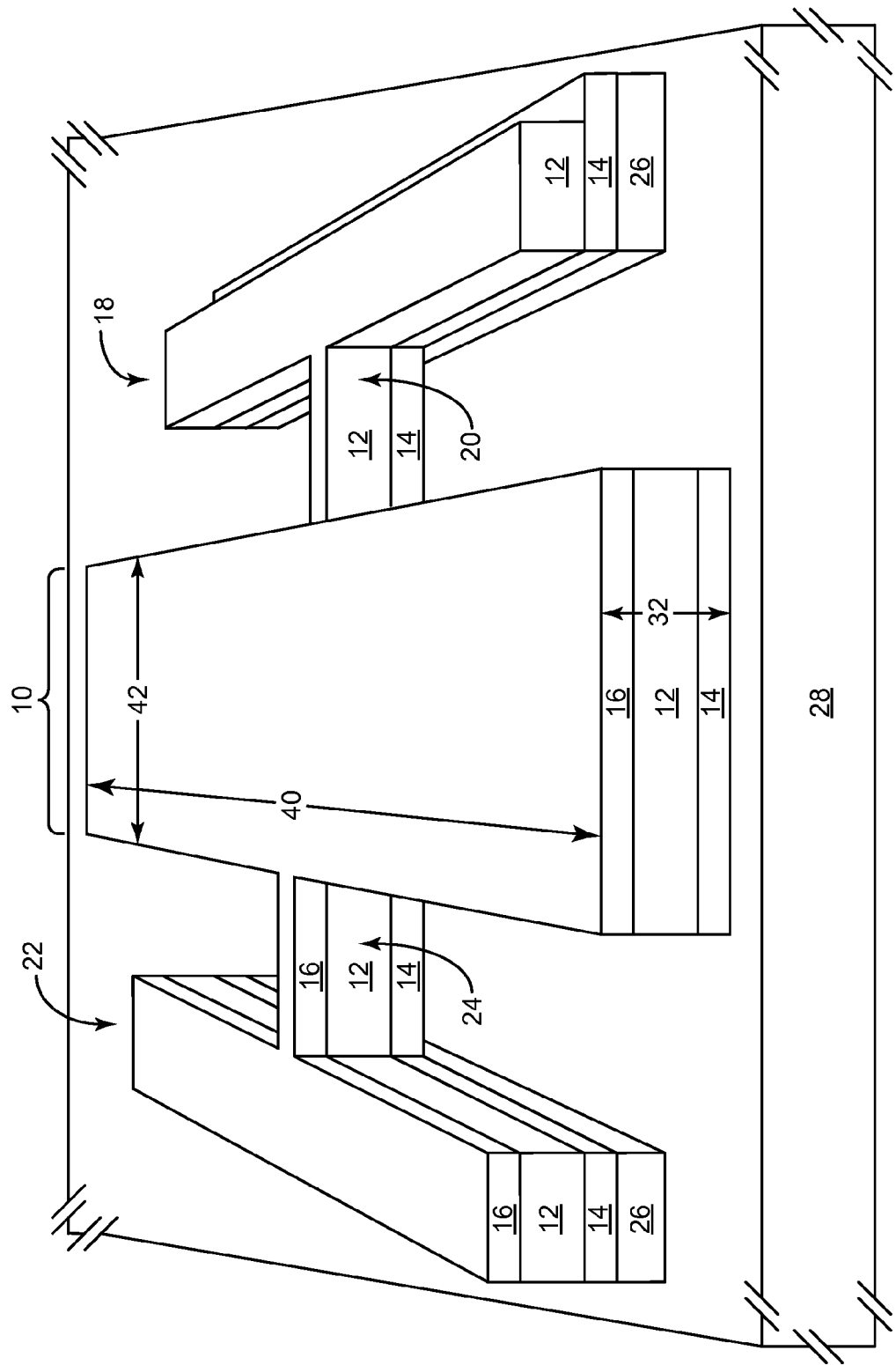
FIG. 6 shows a three-dimensional view of a rectangular-shaped MEMS vibrating structure, according to an additional embodiment of the present invention.

In a fifteenth embodiment of the MEMS vibrating structure 10, the shape of the MEMS vibrating structure 10 is a rectangle having the outer length 40, the outer width 42, and the thickness 32, as illustrated in FIG. 6. The MEMS vibrating structure 10 may be bisected along the outer length 40 of the MEMS vibrating structure 10 by the first and second mechanical support members 20, 24. The outer length 40 may be longer than the outer width 42. The dominant mode of vibration is a length-extensional mode of vibration, which is one form of lateral vibration, wherein the outer length 40 varies as the MEMS vibrating structure 10 vibrates. In a sixteenth embodiment of the MEMS vibrating structure 10, the shape of the MEMS vibrating structure 10 is the rectangle, as illustrated in FIG. 6. The dominant mode of vibration is a width-extensional mode of vibration, which is one form of lateral vibration, wherein the outer width 42 varies as the MEMS vibrating structure 10 vibrates.

In a seventeenth embodiment of the MEMS vibrating structure 10, the shape of the MEMS vibrating structure 10 is the rectangle, as illustrated in FIG. 6. The dominant mode of vibration is a thickness-extensional mode of vibration, which is one form of thickness vibration, wherein the thickness 32 varies as the MEMS vibrating structure 10 vibrates. In an eighteenth embodiment of the MEMS vibrating structure 10, the shape of the MEMS vibrating structure 10 is the rectangle, as illustrated in FIG. 6. The dominant mode of vibration is a thickness-shear mode of vibration, which is one form of thickness vibration, wherein as the MEMS vibrating structure 10 vibrates, the top of the single-crystal piezoelectric thin-film layer 12 in the MEMS vibrating structure 10 moves laterally in one direction 34, while the bottom of the single-crystal piezoelectric thin-film layer 12 moves in the opposite direction 36, as illustrated in FIG. 2.

In one embodiment of the MEMS vibrating structure 10, during a first active state, the MEMS vibrating structure 10 vibrates with dominant length-extensional mode vibrations, dominant width-extensional mode vibrations, dominant contour mode vibrations, dominant thickness-extensional mode vibrations, or dominant thickness-shear mode vibrations. Other vibrations may exist, but one vibrating mode will dominate. In other embodiments of the present invention, the MEMS vibrating structure 10 may be of any shape having any of the aforementioned vibrating modes. The MEMS vibrating structure 10 may be supported by any number of mechanical support members from any number of anchors. The mechanical support members may be attached to the MEMS vibrating structure 10 at any locations.

The first active state is entered by applying a driving AC voltage between the first conducting layer 14 and the second conducting layer 16 at the MEMS vibrating structure 10. The dominant vibrations may be caused by a piezoelectric effect produced by the driving AC voltage. A first inactive state exists when no driving AC voltage is applied. Typically, the driving AC voltage may be applied to the first conducting layer 14 on the first anchor 18, which is electrically attached to the first conducting layer 14 on the MEMS vibrating structure 10 through the first conducting layer 14 on the corresponding mechanical support member 20, 24. Likewise, the driving AC voltage may be applied to the second conducting layer 16 on the second anchor 22, which is electrically attached to the second conducting layer 16 on the MEMS vibrating structure 10 through the second conducting layer 16 on the second mechanical support member 24. Alternate embodiments of the present invention may use other mechanisms for coupling the driving AC signal to the MEMS vibrating structure 10, such as wire bonding. The driving AC signal may be sinusoidal or may be a periodic waveform of any shape. In alternate embodiments of the present invention, the MEMS vibrating structure 10 may be of any shape.

The first conducting layer 14 may be a metallization layer, which may include Chromium or other metal, and the second conducting layer 16 may be a metallization layer, which may include Chromium or other metal. The thickness of the single-crystal piezoelectric thin-film layer 12 in the MEMS vibrating structure 10 may be less than about ten micrometers. In a first exemplary embodiment of the present invention, the thickness of the single-crystal piezoelectric thin-film layer 12 in the MEMS vibrating structure 10 may be less than about one micro-meter.

The single-crystal piezoelectric thin film layer 12 in the MEMS vibrating structure 10 may include Lithium Tantalate, Lithium Niobate, Quartz, Langasite, Langanate, Langatate, Potassium Niobate, or any combination thereof. The substrate 28 may include Lithium Tantalate, Lithium Niobate, Quartz, Silicon, Gallium Arsenide, Langasite, Langanate, Langatate, Potassium Niobate, or any combination thereof. A motional impedance presented between the first and second conducting layers 14, 16 may be less than about 100 ohms at a first frequency. In an exemplary embodiment of the present invention, the motional impedance presented between the first and second conducting layers 14, 16 may be less than about 50 ohms at a first frequency.

FIG. 7A is a graph illustrating how the outer diameter 30 of the MEMS vibrating structure 10, which is illustrated in FIG. 1, varies with time. Since the MEMS vibrating structure 10 is in the shape of a disk, the dominant vibrations may be contour mode vibrations and may manifest themselves primarily as changing the outer diameter 30 of the disk over time from a nominal value to a maximum value, back to the nominal value, to a minimum value, back to the nominal value, and so on.

FIG. 7B is a graph illustrating how the outer length 40 of the MEMS vibrating structure 10, which is illustrated in FIG. 4, varies with time. Since the MEMS vibrating structure 10 is in the shape of a square, the vibrations may be length-extensional mode vibrations and may manifest themselves primarily as changing the outer length 40 of the square over time from a nominal value to a maximum value, back to the nominal value, to a minimum value, back to the nominal value, and so on. The outer length 40 of the MEMS vibrating structure 10 illustrated in FIG. 6 may vary in a similar manner.

Figure 7C:
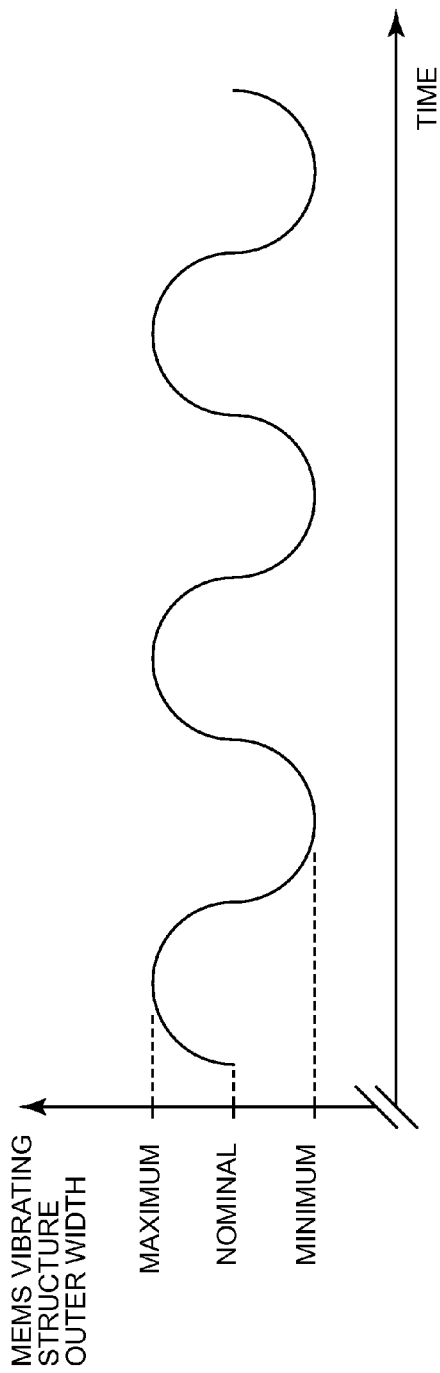

FIG. 7C is a graph illustrating how the outer width 42 of the MEMS vibrating structure 10, which is illustrated in FIG. 4, varies with time. Since the MEMS vibrating structure 10 is in the shape of a square, the dominant vibrations may be width-extensional mode vibrations and may manifest themselves primarily as changing the outer width 42 of the square over time from a nominal value to a maximum value, back to the nominal value, to a minimum value, back to the nominal value, and so on. The outer width 42 of the MEMS vibrating structure 10 illustrated in FIG. 6 may vary in a similar manner.

Figure 7D:
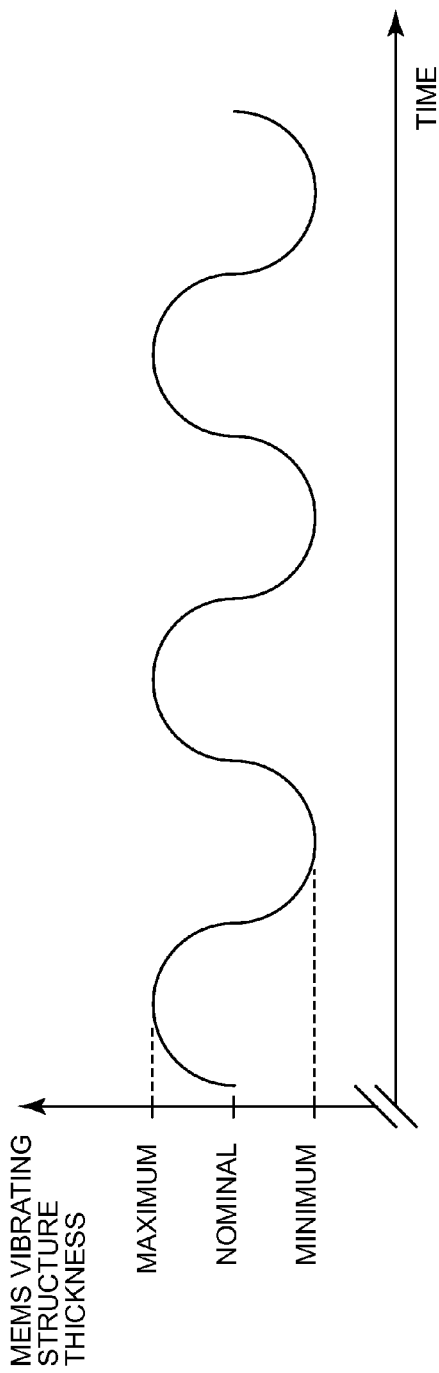

FIG. 7D is a graph illustrating how the thickness 32 of the MEMS vibrating structure 10, which is illustrated in FIG. 1, varies with time. The dominant vibrations may be thickness-extensional mode vibrations and may manifest themselves primarily as changing the thickness 32 of the MEMS vibrating structure 10 over time from a nominal value to a maximum value, back to the nominal value, to a minimum value, back to the nominal value, and so on. The thicknesses 32 of the MEMS vibrating structures 10 illustrated in FIGS. 4 and 6 may vary in a similar manner.

FIGS. 7E and 7F are graphs illustrating how the outer length 40 and the outer width 42 of the MEMS vibrating structure 10, which is illustrated in FIG. 4, vary with time, respectively. Since the MEMS vibrating structure 10 is in the shape of a square, the vibrations may be contour mode vibrations and may manifest themselves primarily as changing the outer length 40 and the outer width 42 simultaneously over time from nominal values to maximum values, back to the nominal values, to minimum values, back to the nominal values, and so on.

FIG. 8 shows a three-dimensional view of an inter-digital-transduced (IDT) MEMS vibrating structure, according to one embodiment of the present invention. The second conducting layer 16 provides a first conducting section 48 on part of the first anchor 18, on the first mechanical support member 20, and on part of the MEMS vibrating structure 10. The second conducting layer 16 provides a second conducting section 50 on the second anchor 22, on the second mechanical support member 24, and on part of the MEMS vibrating structure 10. On the first anchor 18, the second conducting layer 16 and the single-crystal piezoelectric thin-film layer 12 may be etched away to provide an electrical connection to the first conducting layer 14. The first conducting layer 14, the first conducting section 48, and the second conducting section 50 may be electrically isolated from one another. A MEMS vibrating structure 10 having multiple segments may be called an inter-digital transducer.

FIG. 9 shows a top view of the MEMS vibrating structure 10 illustrated in FIG. 8. The first and second conducting sections 48, 50 segment the MEMS vibrating structure 10 into a first segment 52, a second segment 54, and a third segment 56. Each of the first, second, and third segments 52, 54, 56 is rectangular in shape with the first conducting section 48 providing a first conducting finger 58 down the center of the first segment 52 and a second conducting finger 60 down the center of the second segment 54, and the second conducting section 50 providing a third conducting finger 62 down the center of the third segment 56. Normally, a first AC voltage is applied between the first conducting layer 14 and the first conducting section 48, and a second AC voltage, which is phase-shifted about 180 degrees from the first AC voltage, is applied between the first conducting layer 14 and the second conducting section 50. Therefore, the voltages surrounding the first and second segments 52, 54 are phase-shifted about 180 degrees from the voltage surrounding the third segment 56, which drives the first and second segments 52, 54 in directions that are opposite to the direction of the third segment 56.

For example, when the first and second segments 52, 54 are being driven to minimize the widths of the first and second segments 52, 54, the third segment 56 is being driven to maximize the width of the third segment 56, as illustrated in FIGS. 10A, 10B, and 10C. By sub-dividing the MEMS vibrating structure 10 into segments, each segment may vibrate at a higher frequency than an un-segmented MEMS vibrating structure 10. The higher frequencies may be better suited for certain RF applications. Alternate embodiments of the present invention may use any number of segments of any shape. The first and second AC voltages may be sinusoidal or may be periodic waveforms of any shape. In one embodiment of the present invention, the dominant mode of vibration is an IDT mode of vibration, which is one form of lateral vibration, wherein the widths of the first, second, and third segments 52, 54, 56 vary as the MEMS vibrating structure 10 vibrates.

An alternative to the IDT MEMS vibrating structure 10 illustrated in FIG. 8 is a periodically-poled-transduced (PPT) vibrating structure, according to an alternate embodiment of the present invention. Whereas the IDT MEMS vibrating structure 10 illustrated in FIG. 9 uses the first, second, and third conducting fingers 58, 60, 62 to drive the first, second, and third segments 52, 54, 56, respectively, at higher frequencies than an un-segmented MEMS vibrating structure 10, a PPT MEMS vibrating structure 10, where the single-crystal piezoelectric thin-film layer 12 is periodically poled instead of single domain poled, may use lumped top and bottom electrodes, which may be similar to the MEMS vibrating structure 10 illustrated in FIG. 4. The lumped top and bottom electrodes may be periodically driven and sensed to achieve high-order bulk modes, such as plate waves, which may provide high operating frequencies similar to the IDT MEMS vibrating structure 10. However, the PPT MEMS vibrating structure 10 may provide a higher transduction area, a lower electrode resistance, and higher power handling capability than a similar IDT MEMS vibrating structure 10. In one embodiment of the present invention, the dominant mode of vibration is a PPT mode of vibration, which is one form of lateral vibration, wherein plate waves are distributed across the MEMS vibrating structure 10.

The MEMS vibrating structures 10 illustrated in FIGS. 1, 3, 4, 5, and 6 are examples of single-port disk resonators. The MEMS vibrating structure 10 illustrated in FIG. 9 is an example of a dual-port IDT or dual-port resonator. In alternate embodiments of the present invention, the MEMS vibrating structure 10 may be of any shape, may be a single-port resonator, may be a dual-port resonator, or any combination thereof. The MEMS vibrating structures 10 illustrated in FIGS. 1, 3, 4, 5, and 6 are shown with the single-crystal piezoelectric thin-film layer 12 sandwiched between the first conducting layer 14 and the second conducting layer 16. The single-crystal piezoelectric thin-film layer 12 provides a body of the MEMS vibrating structure 10. In alternate embodiments of the present invention, the body of the MEMS vibrating structure 10 may include the single-crystal piezoelectric thin-film layer 12 and one or more additional layers of any material in any arrangement.

Figure 11A:
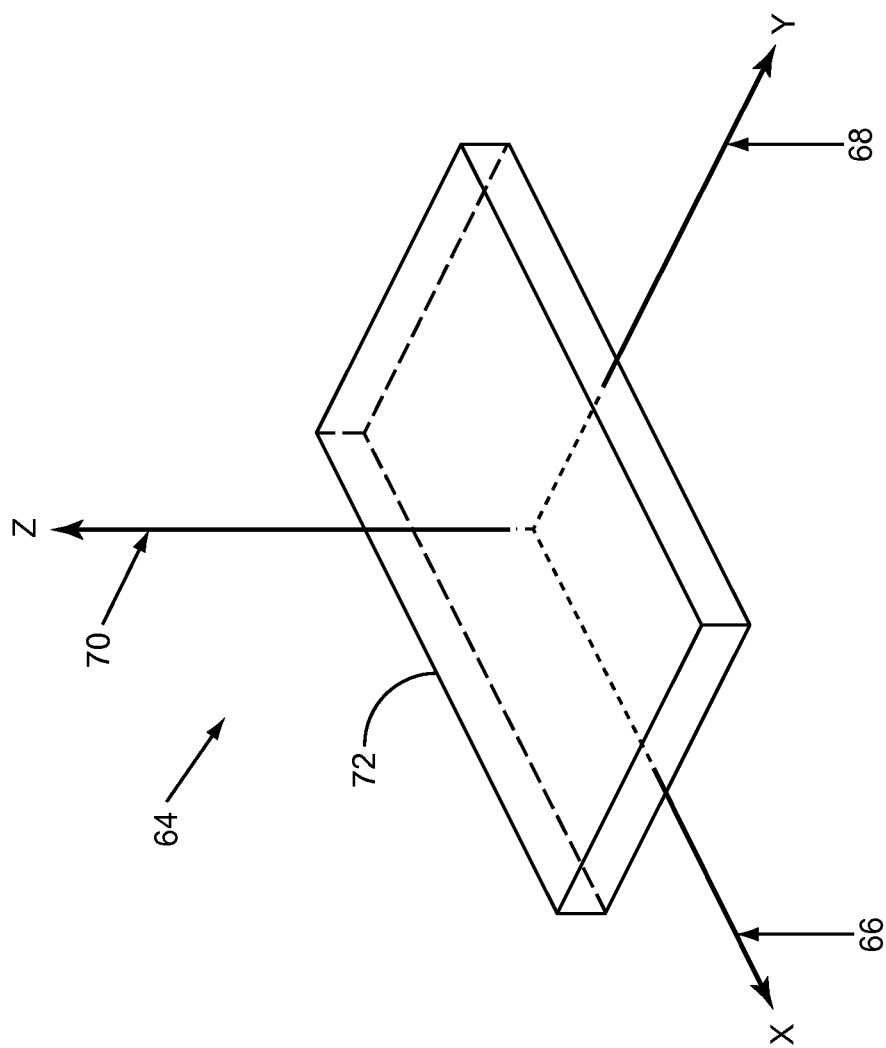

FIGS. 11A, 11B, 11C, 11D, 11E, and 11F show Cartesian Coordinate Systems for illustrating orientations of the uniform crystalline structure of the single-crystal piezoelectric thin-film layer 12 relative to the MEMS vibrating structures 10 illustrated in FIGS. 1, 3, 4, 5, 6, 8, and 9. FIG. 11A shows a Cartesian Coordinate System 64 having an X-axis (X) 66, a Y-axis (Y) 68, and a Z-axis (Z) 70, all three of which are about perpendicular to one another. Additionally, FIG. 11A illustrates a crystalline structure 72 of the single-crystal piezoelectric thin-film layer 12 that is aligned with the Cartesian Coordinate System 64. The crystalline structure 72 may be provided from a z-cut wafer or from a z-oriented boule, which is a single-crystal ingot.

Figure 11B:
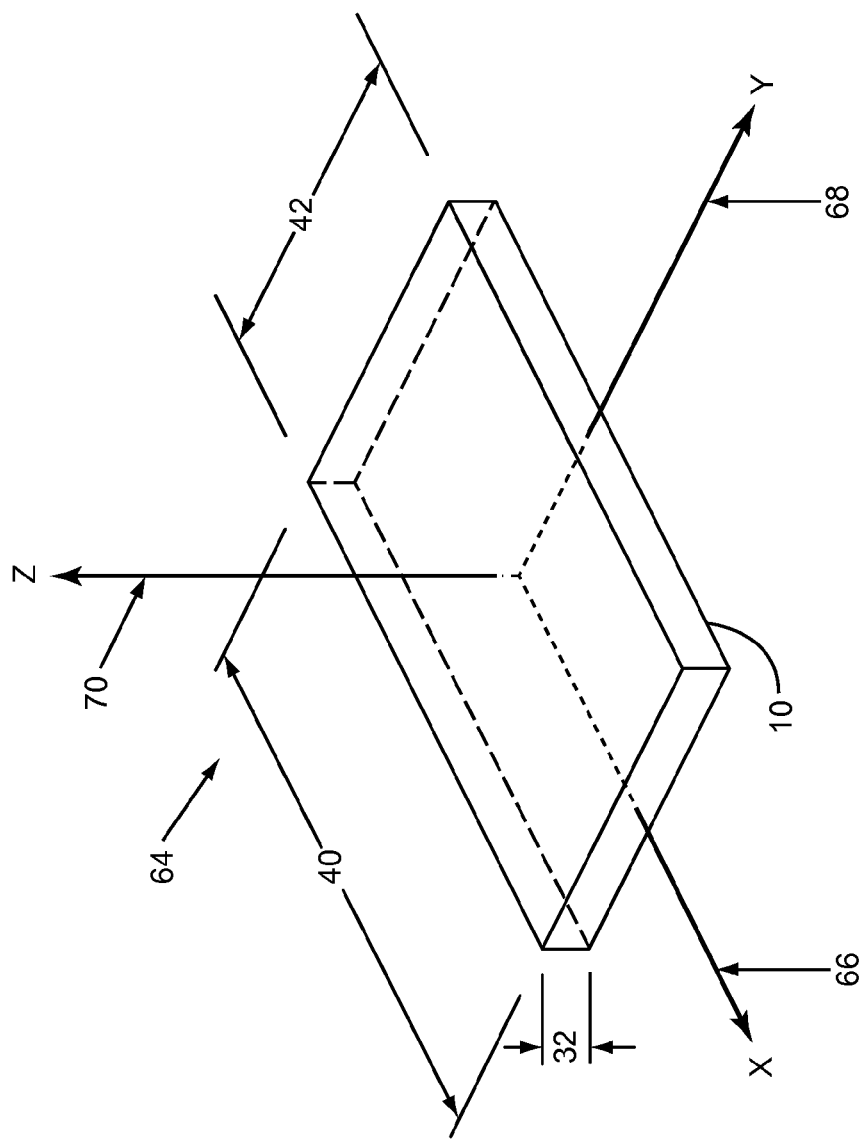

FIG. 11B shows the Cartesian Coordinate System 64 illustrated in FIG. 11A having the rectangular-shaped MEMS vibrating structure 10 (FIG. 6) aligned with the Cartesian Coordinate System 64. The rectangular-shaped MEMS vibrating structure 10 includes the outer length 40, which is about parallel with the X-axis (X) 66, the outer width 42, which is about parallel with the Y-axis (Y) 68, and the thickness 32, which is about parallel with the Z-axis (Z) 70.

The crystalline structure 72 of the single-crystal piezoelectric thin-film layer 12 will remain aligned with the Cartesian Coordinate System 64. However, the Cartesian Coordinate System 64 will be translated to create translated Cartesian Coordinate Systems, which will be aligned with the MEMS vibrating structure 10, as illustrated in FIGS. 1, 3, 4, 5, 6, 8, and 9. Therefore, the orientation of the uniform crystalline structure of the single-crystal piezoelectric thin-film layer 12 relative to the MEMS vibrating structures 10 illustrated in FIGS. 1, 3, 4, 5, 6, 8, and 9 may be characterized by the translations between the Cartesian Coordinate System 64 and the translated Cartesian Coordinate Systems. Euler angles will be used to characterize the translations between the Cartesian Coordinate System 64 and the translated Cartesian Coordinate Systems. Since the disk-shaped and circular-ring shaped MEMS vibrating structures 10 (FIGS. 1 and 3) do not have the discernable outer lengths 40 and the outer widths 42, alignments in the plane of the X-axis (X) 66 and the Y-axis (Y) 68 for these MEMS vibrating structures 10 are arbitrary.

Figure 11C:
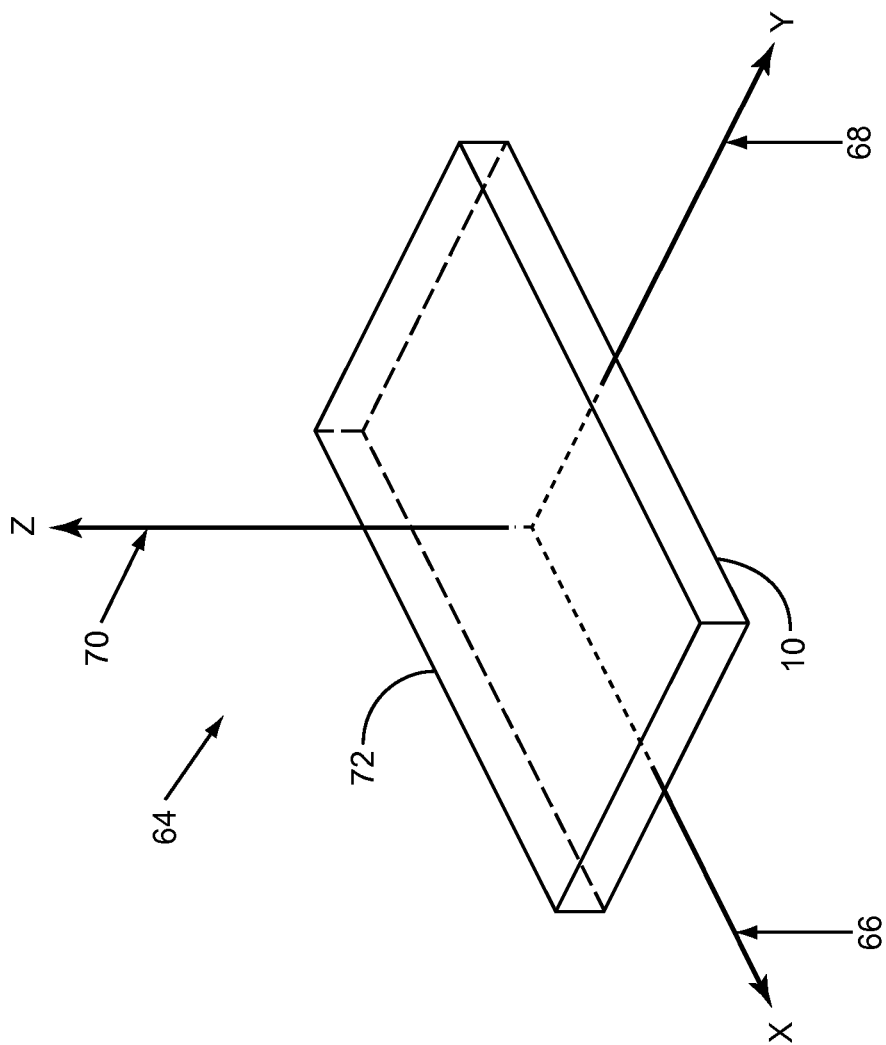

FIG. 11C shows the Cartesian Coordinate System 64 coincident with the crystalline structure 72, which is coincident with the rectangular-shaped MEMS vibrating structure 10. Therefore, before translating the Cartesian Coordinate System 64, the crystalline structure 72 of the single-crystal piezoelectric thin-film layer 12 is aligned with the MEMS vibrating structure 10. Historically, Euler angles have been used to characterize three-dimensional orientations of one structure relative to another structure.

Figure 11D:
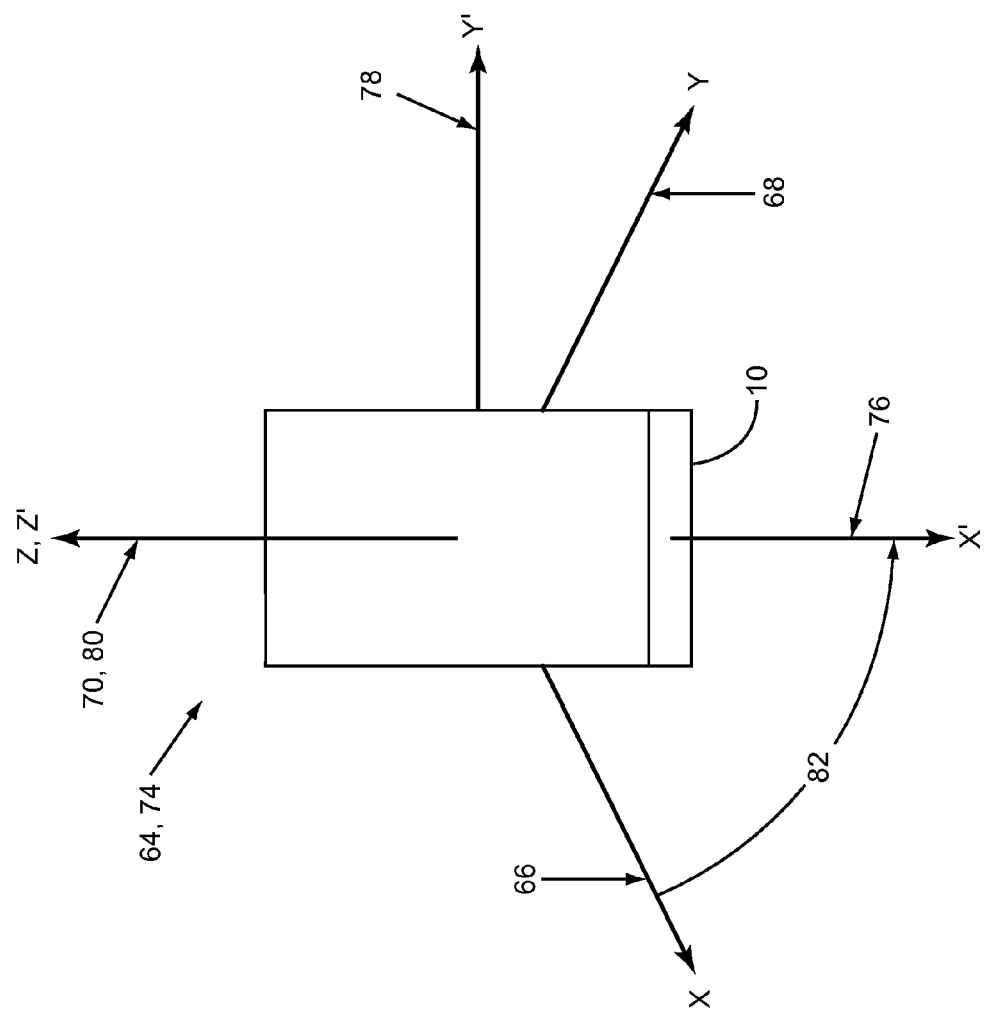

FIG. 11D shows the Cartesian Coordinate System 64 and a first translated Cartesian Coordinate System 74, which is obtained by keeping the Z-axis (Z) 70 stationary and rotating the X-axis (X) 66 toward the Y-axis (Y) 68 to form a first translated X-axis (X'), a first translated Y-axis (Y'), and a first translated Z-axis (Z') 76, 78, 80, which are all perpendicular to one another. A first Euler angle 82 is the angle formed between the X-axis (X) 66 and the first translated X-axis (X') 76. The first translated Z-axis (Z') 80 is coincident with the Z-axis (Z) 70.

FIG. 11E shows the Cartesian Coordinate System 64 and a second translated Cartesian Coordinate System 84, which is obtained by keeping the first translated X-axis (X') 76 stationary and rotating the first translated Z-axis (Z') 80 away from the first translated Y-axis (Y') 78 to form a second translated X-axis (X''), a second translated Y-axis (Y''), and a second translated Z-axis (Z'') 86, 88, 90, which are all perpendicular to one another. A second Euler angle 92, which is achieved after obtaining the first Euler angle 82, is the angle formed between the Z-axis (Z) 70 and the second translated Z-axis (Z'') 90. Since the first translated Z-axis (Z') 80 is coincident with the Z-axis (Z) 70, the second Euler angle 92 is equal to the angle formed between the first translated Z-axis (Z') 80 and the second translated Z-axis (Z'') 90. The first translated X-axis (X') 76 is coincident with second translated X-axis (X'') 86.

Figure 11F:
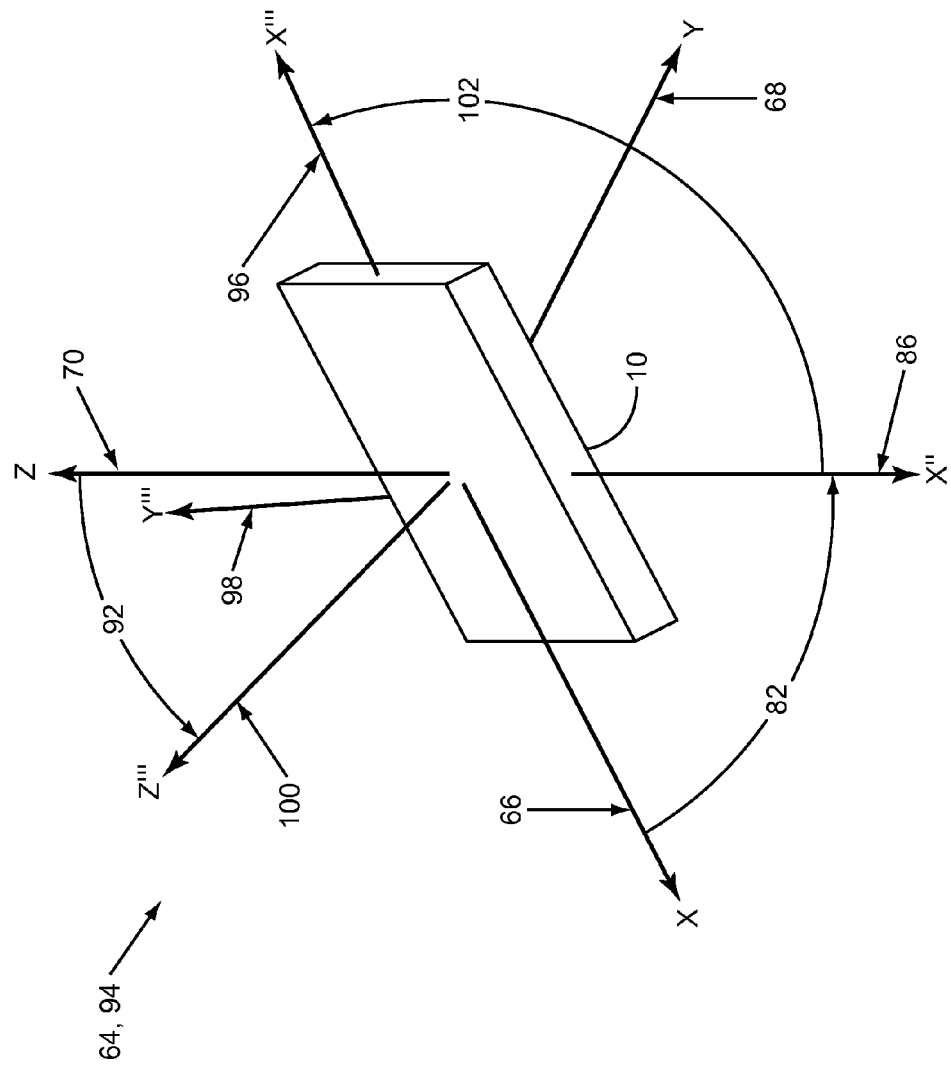

FIG. 11F shows the Cartesian Coordinate System 64 and a third translated Cartesian Coordinate System 94, which is obtained by keeping the second translated Z-axis (Z'') 90 stationary and rotating the second translated X-axis (X'') 86 toward the second translated Y-axis (Y'') 88 to form a third translated X-axis (X'''), a third translated Y-axis (Y'''), and a third translated Z-axis (Z''') 96, 98, 100, which are all perpendicular to one another. A third Euler angle 102, which is achieved after obtaining the second Euler angle 92, is the angle formed between the second translated X-axis (X'') 86 and the third translated X-axis (X''') 96. Since the first translated X-axis (X') 76 is coincident with the second translated X-axis (X'') 86, the third Euler angle 102 is equal to the angle formed between the first translated X-axis (X') 76 and the third translated X-axis (X''') 96. The second translated Z-axis (Z'') 90 is coincident with third translated Z-axis (Z''') 100. T102*he* first Euler angle 82 is called Phi (Φ)), the second Euler angle 92 is called Theta (θ), and the third Euler angle 102 is called Psi (ψ).

Non-standard orientations of the uniform crystalline structure of the single-crystal piezoelectric thin-film layer 12 relative to the MEMS vibrating structures 10 may include any or all of a first Lithium Tantalate Contour Mode orientation defined by a first Lithium Tantalate Contour Mode Euler angle set, a second Lithium Tantalate Contour Mode orientation defined by a second Lithium Tantalate Contour Mode Euler angle set, a third Lithium Tantalate Contour Mode orientation defined by a third Lithium Tantalate Contour Mode Euler angle set, a fourth Lithium Tantalate Contour Mode orientation defined by a fourth Lithium Tantalate Contour Mode Euler angle set, a fifth Lithium Tantalate Contour Mode orientation defined by a fifth Lithium Tantalate Contour Mode Euler angle set, a sixth Lithium Tantalate Contour Mode orientation defined by a sixth Lithium Tantalate Contour Mode Euler angle set, a first Lithium Niobate Contour Mode orientation defined by a first Lithium Niobate Contour Mode Euler angle set, a second Lithium Niobate Contour Mode orientation defined by a second Lithium Niobate Contour Mode Euler angle set, a third Lithium Niobate Contour Mode orientation defined by a third Lithium Niobate Contour Mode Euler angle set, a fourth Lithium Niobate Contour Mode orientation defined by a fourth Lithium Niobate Contour Mode Euler angle set, a fifth Lithium Niobate Contour Mode orientation defined by a fifth Lithium Niobate Contour Mode Euler angle set, and a sixth Lithium Niobate Contour Mode orientation defined by a sixth Lithium Niobate Contour Mode Euler angle set.

Additionally, non-standard orientations of the uniform crystalline structure of the single-crystal piezoelectric thin-film layer 12 relative to the MEMS vibrating structures 10 may include any or all of a first Lithium Tantalate Length-Extensional Mode orientation defined by a first Lithium Tantalate Length-Extensional Mode Euler angle set, a second Lithium Tantalate Length-Extensional Mode orientation defined by a second Lithium Tantalate Length-Extensional Mode Euler angle set, a third Lithium Tantalate Length-Extensional Mode orientation defined by a third Lithium Tantalate Length-Extensional Mode Euler angle set, a fourth Lithium Tantalate Length-Extensional Mode orientation defined by a fourth Lithium Tantalate Length-Extensional Mode Euler angle set, a fifth Lithium Tantalate Length-Extensional Mode orientation defined by a fifth Lithium Tantalate Length-Extensional Mode Euler angle set, a sixth Lithium Tantalate Length-Extensional Mode orientation defined by a sixth Lithium Tantalate Length-Extensional Mode Euler angle set, a seventh Lithium Tantalate Length-Extensional Mode orientation defined by a seventh Lithium Tantalate Length-Extensional Mode Euler angle set, an eighth Lithium Tantalate Length-Extensional Mode orientation defined by an eighth Lithium Tantalate Length-Extensional Mode Euler angle set, a ninth Lithium Tantalate Length-Extensional Mode orientation defined by a ninth Lithium Tantalate Length-Extensional Mode Euler angle set, a tenth Lithium Tantalate Length-Extensional Mode orientation defined by a tenth Lithium Tantalate Length-Extensional Mode Euler angle set, an eleventh Lithium Tantalate Length-Extensional Mode orientation defined by an eleventh Lithium Tantalate Length-Extensional Mode Euler angle set, and a twelfth Lithium Tantalate Length-Extensional Mode orientation defined by a twelfth Lithium Tantalate Length-Extensional Mode Euler angle set.

Further, non-standard orientations of the uniform crystalline structure of the single-crystal piezoelectric thin-film layer 12 relative to the MEMS vibrating structures 10 may include any or all of a first Lithium Niobate Length-Extensional Mode orientation defined by a first Lithium Niobate Length-Extensional Mode Euler angle set, a second Lithium Niobate Length-Extensional Mode orientation defined by a second Lithium Niobate Length-Extensional Mode Euler angle set, a third Lithium Niobate Length-Extensional Mode orientation defined by a third Lithium Niobate Length-Extensional Mode Euler angle set, a fourth Lithium Niobate Length-Extensional Mode orientation defined by a fourth Lithium Niobate Length-Extensional Mode Euler angle set, a fifth Lithium Niobate Length-Extensional Mode orientation defined by a fifth Lithium Niobate Length-Extensional Mode Euler angle set, a sixth Lithium Niobate Length-Extensional Mode orientation defined by a sixth Lithium Niobate Length-Extensional Mode Euler angle set, a seventh Lithium Niobate Length-Extensional Mode orientation defined by a seventh Lithium Niobate Length-Extensional Mode Euler angle set, an eighth Lithium Niobate Length-Extensional Mode orientation defined by an eighth Lithium Niobate Length-Extensional Mode Euler angle set, a ninth Lithium Niobate Length-Extensional Mode orientation defined by a ninth Lithium Niobate Length-Extensional Mode Euler angle set, a tenth Lithium Niobate Length-Extensional Mode orientation defined by a tenth Lithium Niobate Length-Extensional Mode Euler angle set, an eleventh Lithium Niobate Length-Extensional Mode orientation defined by an eleventh Lithium Niobate Length-Extensional Mode Euler angle set, and a twelfth Lithium Niobate Length-Extensional Mode orientation defined by a twelfth Lithium Niobate Length-Extensional Mode Euler angle set.

For length-extensional modes, the rectangular-shaped MEMS vibrating structure 10 may include the outer length 40, which is about parallel with the X-axis (X) 66, the outer width 42, which is about parallel with the Y-axis (Y) 68, and the thickness 32, which is about parallel with the Z-axis (Z) 70 (FIG. 11B).

Continuing, non-standard orientations of the uniform crystalline structure of the single-crystal piezoelectric thin-film layer 12 relative to the MEMS vibrating structures 10 may include any or all of a first Lithium Tantalate Width-Extensional Mode orientation defined by a first Lithium Tantalate Width-Extensional Mode Euler angle set, a second Lithium Tantalate Width-Extensional Mode orientation defined by a second Lithium Tantalate Width-Extensional Mode Euler angle set, a third Lithium Tantalate Width-Extensional Mode orientation defined by a third Lithium Tantalate Width-Extensional Mode Euler angle set, a fourth Lithium Tantalate Width-Extensional Mode orientation defined by a fourth Lithium Tantalate Width-Extensional Mode Euler angle set, a fifth Lithium Tantalate Width-Extensional Mode orientation defined by a fifth Lithium Tantalate Width-Extensional Mode Euler angle set, a sixth Lithium Tantalate Width-Extensional Mode orientation defined by a sixth Lithium Tantalate Width-Extensional Mode Euler angle set, a seventh Lithium Tantalate Width-Extensional Mode orientation defined by a seventh Lithium Tantalate Width-Extensional Mode Euler angle set, an eighth Lithium Tantalate Width-Extensional Mode orientation defined by an eighth Lithium Tantalate Width-Extensional Mode Euler angle set, a ninth Lithium Tantalate Width-Extensional Mode orientation defined by a ninth Lithium Tantalate Width-Extensional Mode Euler angle set, a tenth Lithium Tantalate Width-Extensional Mode orientation defined by a tenth Lithium Tantalate Width-Extensional Mode Euler angle set, an eleventh Lithium Tantalate Width-Extensional Mode orientation defined by an eleventh Lithium Tantalate Width-Extensional Mode Euler angle set, and a twelfth Lithium Tantalate Width-Extensional Mode orientation defined by a twelfth Lithium Tantalate Width-Extensional Mode Euler angle set.

In addition, non-standard orientations of the uniform crystalline structure of the single-crystal piezoelectric thin-film layer 12 relative to the MEMS vibrating structures 10 may include any or all of a first Lithium Niobate Width-Extensional Mode orientation defined by a first Lithium Niobate Width-Extensional Mode Euler angle set, a second Lithium Niobate Width-Extensional Mode orientation defined by a second Lithium Niobate Width-Extensional Mode Euler angle set, a third Lithium Niobate Width-Extensional Mode orientation defined by a third Lithium Niobate Width-Extensional Mode Euler angle set, a fourth Lithium Niobate Width-Extensional Mode orientation defined by a fourth Lithium Niobate Width-Extensional Mode Euler angle set, a fifth Lithium Niobate Width-Extensional Mode orientation defined by a fifth Lithium Niobate Width-Extensional Mode Euler angle set, a sixth Lithium Niobate Width-Extensional Mode orientation defined by a sixth Lithium Niobate Width-Extensional Mode Euler angle set, a seventh Lithium Niobate Width-Extensional Mode orientation defined by a seventh Lithium Niobate Width-Extensional Mode Euler angle set, an eighth Lithium Niobate Width-Extensional Mode orientation defined by an eighth Lithium Niobate Width-Extensional Mode Euler angle set, a ninth Lithium Niobate Width-Extensional Mode orientation defined by a ninth Lithium Niobate Width-Extensional Mode Euler angle set, a tenth Lithium Niobate Width-Extensional Mode orientation defined by a tenth Lithium Niobate Width-Extensional Mode Euler angle set, an eleventh Lithium Niobate Width-Extensional Mode orientation defined by an eleventh Lithium Niobate Width-Extensional Mode Euler angle set, and a twelfth Lithium Niobate Width-Extensional Mode orientation defined by a twelfth Lithium Niobate Width-Extensional Mode Euler angle set.

For width-extensional modes, the rectangular-shaped MEMS vibrating structure 10 includes the outer length 40, which is about parallel with the Y-axis (Y) 68, the outer width 42, which is about parallel with the X-axis (X) 66, and the thickness 32, which is about parallel with the Z-axis (Z) 70 (FIG. 11B).

Further, non-standard orientations of the uniform crystalline structure of the single-crystal piezoelectric thin-film layer 12 relative to the MEMS vibrating structures 10 may include any or all of a first Lithium Tantalate Thickness-Extensional Mode orientation defined by a first Lithium Tantalate Thickness-Extensional Mode Euler angle set, a second Lithium Tantalate Thickness-Extensional Mode orientation defined by a second Lithium Tantalate Thickness-Extensional Mode Euler angle set, a third Lithium Tantalate Thickness-Extensional Mode orientation defined by a third Lithium Tantalate Thickness-Extensional Mode Euler angle set, a fourth Lithium Tantalate Thickness-Extensional Mode orientation defined by a fourth Lithium Tantalate Thickness-Extensional Mode Euler angle set, a fifth Lithium Tantalate Thickness-Extensional Mode orientation defined by a fifth Lithium Tantalate Thickness-Extensional Mode Euler angle set, and a sixth Lithium Tantalate Thickness-Extensional Mode orientation defined by a sixth Lithium Tantalate Thickness-Extensional Mode Euler angle set.

Continuing, non-standard orientations of the uniform crystalline structure of the single-crystal piezoelectric thin-film layer 12 relative to the MEMS vibrating structures 10 may include any or all of a first Lithium Niobate Thickness-Extensional Mode orientation defined by a first Lithium Niobate Thickness-Extensional Mode Euler angle set, a second Lithium Niobate Thickness-Extensional Mode orientation defined by a second Lithium Niobate Thickness-Extensional Mode Euler angle set, a third Lithium Niobate Thickness-Extensional Mode orientation defined by a third Lithium Niobate Thickness-Extensional Mode Euler angle set, a fourth Lithium Niobate Thickness-Extensional Mode orientation defined by a fourth Lithium Niobate Thickness-Extensional Mode Euler angle set, a fifth Lithium Niobate Thickness-Extensional Mode orientation defined by a fifth Lithium Niobate Thickness-Extensional Mode Euler angle set, and a sixth Lithium Niobate Thickness-Extensional Mode orientation defined by a sixth Lithium Niobate Thickness-Extensional Mode Euler angle set.

Additionally, non-standard orientations of the uniform crystalline structure of the single-crystal piezoelectric thin-film layer 12 relative to the MEMS vibrating structures 10 may include any or all of a first Lithium Tantalate Thickness-Shear Mode orientation defined by a first Lithium Tantalate Thickness-Shear Mode Euler angle set, a second Lithium Tantalate Thickness-Shear Mode orientation defined by a second Lithium Tantalate Thickness-Shear Mode Euler angle set, a third Lithium Tantalate Thickness-Shear Mode orientation defined by a third Lithium Tantalate Thickness-Shear Mode Euler angle set, a fourth Lithium Tantalate Thickness-Shear Mode orientation defined by a fourth Lithium Tantalate Thickness-Shear Mode Euler angle set, a fifth Lithium Tantalate Thickness-Shear Mode orientation defined by a fifth Lithium Tantalate Thickness-Shear Mode Euler angle set, a sixth Lithium Tantalate Thickness-Shear Mode orientation defined by a sixth Lithium Tantalate Thickness-Shear Mode Euler angle set, a first Lithium Niobate Thickness-Shear Mode orientation defined by a first Lithium Niobate Thickness-Shear Mode Euler angle set, a second Lithium Niobate Thickness-Shear Mode orientation defined by a second Lithium Niobate Thickness-Shear Mode Euler angle set, a third Lithium Niobate Thickness-Shear Mode orientation defined by a third Lithium Niobate Thickness-Shear Mode Euler angle set, a fourth Lithium Niobate Thickness-Shear Mode orientation defined by a fourth Lithium Niobate Thickness-Shear Mode Euler angle set, a fifth Lithium Niobate Thickness-Shear Mode orientation defined by a fifth Lithium Niobate Thickness-Shear Mode Euler angle set, and a sixth Lithium Niobate Thickness-Shear Mode orientation defined by a sixth Lithium Niobate Thickness-Shear Mode Euler angle set.

The first Lithium Tantalate Contour Mode Euler angle set includes the first Euler angle 82 equal to between about −10 degrees and about 10 degrees, the second Euler angle 92 equal to between about 102 degrees and about 134 degrees, and the third Euler angle 102 equal to between about zero degrees and about 360 degrees.

The second Lithium Tantalate Contour Mode Euler angle set includes the first Euler angle 82 equal to between about 170 degrees and about 190 degrees, the second Euler angle 92 equal to between about 42 degrees and about 74 degrees, and the third Euler angle 102 equal to between about zero degrees and about 360 degrees.

The third Lithium Tantalate Contour Mode Euler angle set includes the first Euler angle 82 equal to between about 110 degrees and about 130 degrees, the second Euler angle 92 equal to between about 102 degrees and about 134 degrees, and the third Euler angle 102 equal to between about zero degrees and about 360 degrees.

The fourth Lithium Tantalate Contour Mode Euler angle set includes the first Euler angle 82 equal to between about 290 degrees and about 310 degrees, the second Euler angle 92 equal to between about 42 degrees and about 74 degrees, and the third Euler angle 102 equal to between about zero degrees and about 360 degrees.

The fifth Lithium Tantalate Contour Mode Euler angle set includes the first Euler angle 82 equal to between about 230 degrees and about 250 degrees, the second Euler angle 92 equal to between about 102 degrees and about 134 degrees, and the third Euler angle 102 equal to between about zero degrees and about 360 degrees.

The sixth Lithium Tantalate Contour Mode Euler angle set includes the first Euler angle 82 equal to between about 50 degrees and about 70 degrees, the second Euler angle 92 equal to between about 42 degrees and about 74 degrees, and the third Euler angle 102 equal to between about zero degrees and about 360 degrees.

The first Lithium Niobate Contour Mode Euler angle set includes the first Euler angle 82 equal to between about −10 degrees and about 10 degrees, the second Euler angle 92 equal to between about 100 degrees and about 141 degrees, and the third Euler angle 102 equal to between about zero degrees and about 360 degrees.

The second Lithium Niobate Contour Mode Euler angle set includes the first Euler angle 82 equal to between about 170 degrees and about 190 degrees, the second Euler angle 92 equal to between about 40 degrees and about 81 degrees, and the third Euler angle 102 equal to between about zero degrees and about 360 degrees.

The third Lithium Niobate Contour Mode Euler angle set includes the first Euler angle 82 equal to between about 110 degrees and about 130 degrees, the second Euler angle 92 equal to between about 100 degrees and about 141 degrees, and the third Euler angle 102 equal to between about zero degrees and about 360 degrees.

The fourth Lithium Niobate Contour Mode Euler angle set includes the first Euler angle 82 equal to between about 290 degrees and about 310 degrees, the second Euler angle 92 equal to between about 40 degrees and about 81 degrees, and the third Euler angle 102 equal to between about zero degrees and about 360 degrees.

The fifth Lithium Niobate Contour Mode Euler angle set includes the first Euler angle 82 equal to between about 230 degrees and about 250 degrees, the second Euler angle 92 equal to between about 100 degrees and about 141 degrees, and the third Euler angle 102 equal to between about zero degrees and about 360 degrees.

The sixth Lithium Niobate Contour Mode Euler angle set includes the first Euler angle 82 equal to between about 50 degrees and about 70 degrees, the second Euler angle 92 equal to between about 40 degrees and about 81 degrees, and the third Euler angle 102 equal to between about zero degrees and about 360 degrees.

In one embodiment of the present invention, the MEMS vibrating structure 10 includes the contour mode of vibration, the single-crystal piezoelectric thin-film layer 12 includes Lithium Tantalate, and non-standard orientations of the uniform crystalline structure of the single-crystal piezoelectric thin-film layer 12 relative to the MEMS vibrating structures 10 include the first, second, third, fourth, fifth, and sixth Lithium Tantalate Contour Mode orientations.

In another embodiment of the present invention, the MEMS vibrating structure 10 includes the contour mode of vibration, the single-crystal piezoelectric thin-film layer 12 includes Lithium Niobate, and non-standard orientations of the uniform crystalline structure of the single-crystal piezoelectric thin-film layer 12 relative to the MEMS vibrating structures 10 include the first, second, third, fourth, fifth, and sixth Lithium Niobate Contour Mode orientations.

The first Lithium Tantalate Length-Extensional Mode Euler angle set includes the first Euler angle 82 equal to between about −10 degrees and about 10 degrees, the second Euler angle 92 equal to between about 21 degrees and about 58 degrees, and the third Euler angle 102 equal to between about 80 degrees and about 100 degrees.

The second Lithium Tantalate Length-Extensional Mode Euler angle set includes the first Euler angle 82 equal to between about 170 degrees and about 190 degrees, the second Euler angle 92 equal to between about 111 degrees and about 148 degrees, and the third Euler angle 102 equal to between about 80 degrees and about 100 degrees.

The third Lithium Tantalate Length-Extensional Mode Euler angle set includes the first Euler angle 82 equal to between about −10 degrees and about 10 degrees, the second Euler angle 92 equal to between about 21 degrees and about 58 degrees, and the third Euler angle 102 equal to between about 260 degrees and about 280 degrees.

The fourth Lithium Tantalate Length-Extensional Mode Euler angle set includes the first Euler angle 82 equal to between about 170 degrees and about 190 degrees, the second Euler angle 92 equal to between about 111 degrees and about 148 degrees, and the third Euler angle 102 equal to between about 260 degrees and about 280 degrees.

The fifth Lithium Tantalate Length-Extensional Mode Euler angle set includes the first Euler angle 82 equal to between about 110 degrees and about 130 degrees, the second Euler angle 92 equal to between about 21 degrees and about 58 degrees, and the third Euler angle 102 equal to between about 80 degrees and about 100 degrees.

The sixth Lithium Tantalate Length-Extensional Mode Euler angle set includes the first Euler angle 82 equal to between about 290 degrees and about 310 degrees, the second Euler angle 92 equal to between about 111 degrees and about 148 degrees, and the third Euler angle 102 equal to between about 80 degrees and about 100 degrees.

The seventh Lithium Tantalate Length-Extensional Mode Euler angle set includes the first Euler angle 82 equal to between about 110 degrees and about 130 degrees, the second Euler angle 92 equal to between about 21 degrees and about 58 degrees, and the third Euler angle 102 equal to between about 260 degrees and about 280 degrees.

The eighth Lithium Tantalate Length-Extensional Mode Euler angle set includes the first Euler angle 82 equal to between about 290 degrees and about 310 degrees, the second Euler angle 92 equal to between about 111 degrees and about 148 degrees, and the third Euler angle 102 equal to between about 260 degrees and about 280 degrees.

The ninth Lithium Tantalate Length-Extensional Mode Euler angle set includes the first Euler angle 82 equal to between about 230 degrees and about 250 degrees, the second Euler angle 92 equal to between about 21 degrees and about 58 degrees, and the third Euler angle 102 equal to between about 80 degrees and about 100 degrees.

The tenth Lithium Tantalate Length-Extensional Mode Euler angle set includes the first Euler angle 82 equal to between about 50 degrees and about 70 degrees, the second Euler angle 92 equal to between about 111 degrees and about 148 degrees, and the third Euler angle 102 equal to between about 80 degrees and about 100 degrees.

The eleventh Lithium Tantalate Length-Extensional Mode Euler angle set includes the first Euler angle 82 equal to between about 230 degrees and about 250 degrees, the second Euler angle 92 equal to between about 21 degrees and about 58 degrees, and the third Euler angle 102 equal to between about 260 degrees and about 280 degrees.

The twelfth Lithium Tantalate Length-Extensional Mode Euler angle set includes the first Euler angle 82 equal to between about 50 degrees and about 70 degrees, the second Euler angle 92 equal to between about 111 degrees and about 148 degrees, and the third Euler angle 102 equal to between about 260 degrees and about 280 degrees.

The first Lithium Niobate Length-Extensional Mode Euler angle set includes the first Euler angle 82 equal to between about −10 degrees and about 10 degrees, the second Euler angle 92 equal to between about 30 degrees and about 60 degrees, and the third Euler angle 102 equal to between about 80 degrees and about 100 degrees.

The second Lithium Niobate Length-Extensional Mode Euler angle set includes the first Euler angle 82 equal to between about 170 degrees and about 190 degrees, the second Euler angle 92 equal to between about 120 degrees and about 150 degrees, and the third Euler angle 102 equal to between about 80 degrees and about 100 degrees.

The third Lithium Niobate Length-Extensional Mode Euler angle set includes the first Euler angle 82 equal to between about −10 degrees and about 10 degrees, the second Euler angle 92 equal to between about 30 degrees and about 60 degrees, and the third Euler angle 102 equal to between about 260 degrees and about 280 degrees.

The fourth Lithium Niobate Length-Extensional Mode Euler angle set includes the first Euler angle 82 equal to between about 170 degrees and about 190 degrees, the second Euler angle 92 equal to between about 120 degrees and about 150 degrees, and the third Euler angle 102 equal to between about 260 degrees and about 280 degrees.

The fifth Lithium Niobate Length-Extensional Mode Euler angle set includes the first Euler angle 82 equal to between about 110 degrees and about 130 degrees, the second Euler angle 92 equal to between about 30 degrees and about 60 degrees, and the third Euler angle 102 equal to between about 80 degrees and about 100 degrees.

The sixth Lithium Niobate Length-Extensional Mode Euler angle set includes the first Euler angle 82 equal to between about 290 degrees and about 310 degrees, the second Euler angle 92 equal to between about 120 degrees and about 150 degrees, and the third Euler angle 102 equal to between about 80 degrees and about 100 degrees.

The seventh Lithium Niobate Length-Extensional Mode Euler angle set includes the first Euler angle 82 equal to between about 110 degrees and about 130 degrees, the second Euler angle 92 equal to between about 30 degrees and about 60 degrees, and the third Euler angle 102 equal to between about 260 degrees and about 280 degrees.

The eighth Lithium Niobate Length-Extensional Mode Euler angle set includes the first Euler angle 82 equal to between about 290 degrees and about 310 degrees, the second Euler angle 92 equal to between about 120 degrees and about 150 degrees, and the third Euler angle 102 equal to between about 260 degrees and about 280 degrees.

The ninth Lithium Niobate Length-Extensional Mode Euler angle set includes the first Euler angle 82 equal to between about 230 degrees and about 250 degrees, the second Euler angle 92 equal to between about 30 degrees and about 60 degrees, and the third Euler angle 102 equal to between about 80 degrees and about 100 degrees.

The tenth Lithium Niobate Length-Extensional Mode Euler angle set includes the first Euler angle 82 equal to between about 50 degrees and about 70 degrees, the second Euler angle 92 equal to between about 120 degrees and about 150 degrees, and the third Euler angle 102 equal to between about 80 degrees and about 100 degrees.

The eleventh Lithium Niobate Length-Extensional Mode Euler angle set includes the first Euler angle 82 equal to between about 230 degrees and about 250 degrees, the second Euler angle 92 equal to between about 30 degrees and about 60 degrees, and the third Euler angle 102 equal to between about 260 degrees and about 280 degrees.

The twelfth Lithium Niobate Length-Extensional Mode Euler angle set includes the first Euler angle 82 equal to between about 50 degrees and about 70 degrees, the second Euler angle 92 equal to between about 120 degrees and about 150 degrees, and the third Euler angle 102 equal to between about 260 degrees and about 280 degrees.

The first Lithium Tantalate Width-Extensional Mode Euler angle set includes the first Euler angle 82 equal to between about −10 degrees and about 10 degrees, the second Euler angle 92 equal to between about 25 degrees and about 55 degrees, and the third Euler angle 102 equal to between about 80 degrees and about 100 degrees.

The second Lithium Tantalate Width-Extensional Mode Euler angle set includes the first Euler angle 82 equal to between about 170 degrees and about 190 degrees, the second Euler angle 92 equal to between about 115 degrees and about 145 degrees, and the third Euler angle 102 equal to between about 80 degrees and about 100 degrees.

The third Lithium Tantalate Width-Extensional Mode Euler angle set includes the first Euler angle 82 equal to between about −10 degrees and about 10 degrees, the second Euler angle 92 equal to between about 25 degrees and about 55 degrees, and the third Euler angle 102 equal to between about 260 degrees and about 280 degrees.

The fourth Lithium Tantalate Width-Extensional Mode Euler angle set includes the first Euler angle 82 equal to between about 170 degrees and about 190 degrees, the second Euler angle 92 equal to between about 115 degrees and about 145 degrees, and the third Euler angle 102 equal to between about 260 degrees and about 280 degrees.

The fifth Lithium Tantalate Width-Extensional Mode Euler angle set includes the first Euler angle 82 equal to between about 110 degrees and about 130 degrees, the second Euler angle 92 equal to between about 25 degrees and about 55 degrees, and the third Euler angle 102 equal to between about 80 degrees and about 100 degrees.

The sixth Lithium Tantalate Width-Extensional Mode Euler angle set includes the first Euler angle 82 equal to between about 290 degrees and about 310 degrees, the second Euler angle 92 equal to between about 115 degrees and about 145 degrees, and the third Euler angle 102 equal to between about 80 degrees and about 100 degrees.

The seventh Lithium Tantalate Width-Extensional Mode Euler angle set includes the first Euler angle 82 equal to between about 110 degrees and about 130 degrees, the second Euler angle 92 equal to between about 25 degrees and about 55 degrees, and the third Euler angle 102 equal to between about 260 degrees and about 280 degrees.

The eighth Lithium Tantalate Width-Extensional Mode Euler angle set includes the first Euler angle 82 equal to between about 290 degrees and about 310 degrees, the second Euler angle 92 equal to between about 115 degrees and about 145 degrees, and the third Euler angle 102 equal to between about 260 degrees and about 280 degrees.

The ninth Lithium Tantalate Width-Extensional Mode Euler angle set includes the first Euler angle 82 equal to between about 230 degrees and about 250 degrees, the second Euler angle 92 equal to between about 25 degrees and about 55 degrees, and the third Euler angle 102 equal to between about 80 degrees and about 100 degrees.

The tenth Lithium Tantalate Width-Extensional Mode Euler angle set includes the first Euler angle 82 equal to between about 50 degrees and about 70 degrees, the second Euler angle 92 equal to between about 115 degrees and about 145 degrees, and the third Euler angle 102 equal to between about 80 degrees and about 100 degrees.

The eleventh Lithium Tantalate Width-Extensional Mode Euler angle set includes the first Euler angle 82 equal to between about 230 degrees and about 250 degrees, the second Euler angle 92 equal to between about 25 degrees and about 55 degrees, and the third Euler angle 102 equal to between about 260 degrees and about 280 degrees.

The twelfth Lithium Tantalate Width-Extensional Mode Euler angle set includes the first Euler angle 82 equal to between about 50 degrees and about 70 degrees, the second Euler angle 92 equal to between about 115 degrees and about 145 degrees, and the third Euler angle 102 equal to between about 260 degrees and about 280 degrees.

The first Lithium Niobate Width-Extensional Mode Euler angle set includes the first Euler angle 82 equal to between about −10 degrees and about 10 degrees, the second Euler angle 92 equal to between about 30 degrees and about 60 degrees, and the third Euler angle 102 equal to between about 80 degrees and about 100 degrees.

The second Lithium Niobate Width-Extensional Mode Euler angle set includes the first Euler angle 82 equal to between about 170 degrees and about 190 degrees, the second Euler angle 92 equal to between about 120 degrees and about 150 degrees, and the third Euler angle 102 equal to between about 80 degrees and about 100 degrees.

The third Lithium Niobate Width-Extensional Mode Euler angle set includes the first Euler angle 82 equal to between about −10 degrees and about 10 degrees, the second Euler angle 92 equal to between about 30 degrees and about 60 degrees, and the third Euler angle 102 equal to between about 260 degrees and about 280 degrees.

The fourth Lithium Niobate Width-Extensional Mode Euler angle set includes the first Euler angle 82 equal to between about 170 degrees and about 190 degrees, the second Euler angle 92 equal to between about 120 degrees and about 150 degrees, and the third Euler angle 102 equal to between about 260 degrees and about 280 degrees.

The fifth Lithium Niobate Width-Extensional Mode Euler angle set includes the first Euler angle 82 equal to between about 110 degrees and about 130 degrees, the second Euler angle 92 equal to between about 30 degrees and about 60 degrees, and the third Euler angle 102 equal to between about 80 degrees and about 100 degrees.

The sixth Lithium Niobate Width-Extensional Mode Euler angle set includes the first Euler angle 82 equal to between about 290 degrees and about 310 degrees, the second Euler angle 92 equal to between about 120 degrees and about 150 degrees, and the third Euler angle 102 equal to between about 80 degrees and about 100 degrees.

The seventh Lithium Niobate Width-Extensional Mode Euler angle set includes the first Euler angle 82 equal to between about 110 degrees and about 130 degrees, the second Euler angle 92 equal to between about 30 degrees and about 60 degrees, and the third Euler angle 102 equal to between about 260 degrees and about 280 degrees.

The eighth Lithium Niobate Width-Extensional Mode Euler angle set includes the first Euler angle 82 equal to between about 290 degrees and about 310 degrees, the second Euler angle 92 equal to between about 120 degrees and about 150 degrees, and the third Euler angle 102 equal to between about 260 degrees and about 280 degrees.

The ninth Lithium Niobate Width-Extensional Mode Euler angle set includes the first Euler angle 82 equal to between about 230 degrees and about 250 degrees, the second Euler angle 92 equal to between about 30 degrees and about 60 degrees, and the third Euler angle 102 equal to between about 80 degrees and about 100 degrees.

The tenth Lithium Niobate Width-Extensional Mode Euler angle set includes the first Euler angle 82 equal to between about 50 degrees and about 70 degrees, the second Euler angle 92 equal to between about 120 degrees and about 150 degrees, and the third Euler angle 102 equal to between about 80 degrees and about 100 degrees.

The eleventh Lithium Niobate Width-Extensional Mode Euler angle set includes the first Euler angle 82 equal to between about 230 degrees and about 250 degrees, the second Euler angle 92 equal to between about 30 degrees and about 60 degrees, and the third Euler angle 102 equal to between about 260 degrees and about 280 degrees.

The twelfth Lithium Niobate Width-Extensional Mode Euler angle set includes the first Euler angle 82 equal to between about 50 degrees and about 70 degrees, the second Euler angle 92 equal to between about 120 degrees and about 150 degrees, and the third Euler angle 102 equal to between about 260 degrees and about 280 degrees.

In one embodiment of the present invention, the MEMS vibrating structure 10 includes the length-extensional mode of vibration, the single-crystal piezoelectric thin-film layer 12 includes Lithium Tantalate, and non-standard orientations of the uniform crystalline structure of the single-crystal piezoelectric thin-film layer 12 relative to the MEMS vibrating structures 10 include the first, second, third, fourth, fifth, sixth, seventh, eighth, ninth, tenth, eleventh, and twelfth Lithium Tantalate Length-Extensional Mode orientations.

In an alternate embodiment of the present invention, the MEMS vibrating structure 10 includes the length-extensional mode of vibration, the single-crystal piezoelectric thin-film layer 12 includes Lithium Niobate, and non-standard orientations of the uniform crystalline structure of the single-crystal piezoelectric thin-film layer 12 relative to the MEMS vibrating structures 10 include the first, second, third, fourth, fifth, sixth, seventh, eighth, ninth, tenth, eleventh, and twelfth Lithium Niobate Length-Extensional Mode orientations.

In an additional embodiment of the present invention, the MEMS vibrating structure 10 includes any of the width-extensional mode of vibration, the IDT mode of vibration, and the PPT mode of vibration, the single-crystal piezoelectric thin-film layer 12 includes Lithium Tantalate, and non-standard orientations of the uniform crystalline structure of the single-crystal piezoelectric thin-film layer 12 relative to the MEMS vibrating structures 10 include the first, second, third, fourth, fifth, sixth, seventh, eighth, ninth, tenth, eleventh, and twelfth Lithium Tantalate Width-Extensional Mode orientations.

In another embodiment of the present invention, the MEMS vibrating structure 10 includes any of the width-extensional mode of vibration, the IDT mode of vibration, and the PPT mode of vibration, the single-crystal piezoelectric thin-film layer 12 includes Lithium Niobate, and non-standard orientations of the uniform crystalline structure of the single-crystal piezoelectric thin-film layer 12 relative to the MEMS vibrating structures 10 include the first, second, third, fourth, fifth, sixth, seventh, eighth, ninth, tenth, eleventh, and twelfth Lithium Niobate Width-Extensional Mode orientations.

The first Lithium Tantalate Thickness-Extensional Mode Euler angle set includes the first Euler angle 82 equal to between about 170 degrees and about 190 degrees, the second Euler angle 92 equal to between about 54 degrees and about 100 degrees, and the third Euler angle 102 equal to between about zero degrees and about 360 degrees.

The second Lithium Tantalate Thickness-Extensional Mode Euler angle set includes the first Euler angle 82 equal to between about 290 degrees and about 310 degrees, the second Euler angle 92 equal to between about 54 degrees and about 100 degrees, and the third Euler angle 102 equal to between about zero degrees and about 360 degrees.

The third Lithium Tantalate Thickness-Extensional Mode Euler angle set includes the first Euler angle 82 equal to between about 50 degrees and about 70 degrees, the second Euler angle 92 equal to between about 54 degrees and about 100 degrees, and the third Euler angle 102 equal to between about zero degrees and about 360 degrees.

The fourth Lithium Tantalate Thickness-Extensional Mode Euler angle set includes the first Euler angle 82 equal to between about −10 degrees and about 10 degrees, the second Euler angle 92 equal to between about 102 degrees and about 148 degrees, and the third Euler angle 102 equal to between about zero degrees and about 360 degrees.

The fifth Lithium Tantalate Thickness-Extensional Mode Euler angle set includes the first Euler angle 82 equal to between about 110 degrees and about 130 degrees, the second Euler angle 92 equal to between about 102 degrees and about 148 degrees, and the third Euler angle 102 equal to between about zero degrees and about 360 degrees.

The sixth Lithium Tantalate Thickness-Extensional Mode Euler angle set includes the first Euler angle 82 equal to between about 230 degrees and about 250 degrees, the second Euler angle 92 equal to between about 102 degrees and about 148 degrees, and the third Euler angle 102 equal to between about zero degrees and about 360 degrees.

The first Lithium Niobate Thickness-Extensional Mode Euler angle set includes the first Euler angle 82 equal to between about 170 degrees and about 190 degrees, the second Euler angle 92 equal to between about 42 degrees and about 75 degrees, and the third Euler angle 102 equal to between about zero degrees and about 360 degrees.

The second Lithium Niobate Thickness-Extensional Mode Euler angle set includes the first Euler angle 82 equal to between about 290 degrees and about 310 degrees, the second Euler angle 92 equal to between about 42 degrees and about 75 degrees, and the third Euler angle 102 equal to between about zero degrees and about 360 degrees.

The third Lithium Niobate Thickness-Extensional Mode Euler angle set includes the first Euler angle 82 equal to between about 50 degrees and about 70 degrees, the second Euler angle 92 equal to between about 42 degrees and about 75 degrees, and the third Euler angle 102 equal to between about zero degrees and about 360 degrees.

The fourth Lithium Niobate Thickness-Extensional Mode Euler angle set includes the first Euler angle 82 equal to between about −10 degrees and about 10 degrees, the second Euler angle 92 equal to between about 106 degrees and about 139 degrees, and the third Euler angle 102 equal to between about zero degrees and about 360 degrees.

The fifth Lithium Niobate Thickness-Extensional Mode Euler angle set includes the first Euler angle 82 equal to between about 110 degrees and about 130 degrees, the second Euler angle 92 equal to between about 106 degrees and about 139 degrees, and the third Euler angle 102 equal to between about zero degrees and about 360 degrees.

The sixth Lithium Niobate Thickness-Extensional Mode Euler angle set includes the first Euler angle 82 equal to between about 230 degrees and about 250 degrees, the second Euler angle 92 equal to between about 106 degrees and about 139 degrees, and the third Euler angle 102 equal to between about zero degrees and about 360 degrees.

In one embodiment of the present invention, the MEMS vibrating structure 10 includes the thickness-extensional mode of vibration, the single-crystal piezoelectric thin-film layer 12 includes Lithium Tantalate, and non-standard orientations of the uniform crystalline structure of the single-crystal piezoelectric thin-film layer 12 relative to the MEMS vibrating structures 10 include the first, second, third, fourth, fifth, and sixth Lithium Tantalate Thickness-Extensional Mode orientations.

In an additional embodiment of the present invention, the MEMS vibrating structure 10 includes the thickness-extensional mode of vibration, the single-crystal piezoelectric thin-film layer 12 includes Lithium Niobate, and non-standard orientations of the uniform crystalline structure of the single-crystal piezoelectric thin-film layer 12 relative to the MEMS vibrating structures 10 include the first, second, third, fourth, fifth, and sixth Lithium Niobate Thickness-Extensional Mode orientations.

The first Lithium Tantalate Thickness-Shear Mode Euler angle set includes the first Euler angle 82 equal to between about 170 degrees and about 190 degrees, the second Euler angle 92 equal to between about 96 degrees and about 120 degrees, and the third Euler angle 102 equal to between about zero degrees and about 360 degrees.

The second Lithium Tantalate Thickness-Shear Mode Euler angle set includes the first Euler angle 82 equal to between about 290 degrees and about 310 degrees, the second Euler angle 92 equal to between about 96 degrees and about 120 degrees, and the third Euler angle 102 equal to between about zero degrees and about 360 degrees.

The third Lithium Tantalate Thickness-Shear Mode Euler angle set includes the first Euler angle 82 equal to between about 50 degrees and about 70 degrees, the second Euler angle 92 equal to between about 96 degrees and about 120 degrees, and the third Euler angle 102 equal to between about zero degrees and about 360 degrees.

The fourth Lithium Tantalate Thickness-Shear Mode Euler angle set includes the first Euler angle 82 equal to between about −10 degrees and about 10 degrees, the second Euler angle 92 equal to between about 68 degrees and about 92 degrees, and the third Euler angle 102 equal to between about zero degrees and about 360 degrees.

The fifth Lithium Tantalate Thickness-Shear Mode Euler angle set includes the first Euler angle 82 equal to between about 110 degrees and about 130 degrees, the second Euler angle 92 equal to between about 68 degrees and about 92 degrees, and the third Euler angle 102 equal to between about zero degrees and about 360 degrees.

The sixth Lithium Tantalate Thickness-Shear Mode Euler angle set includes the first Euler angle 82 equal to between about 230 degrees and about 250 degrees, the second Euler angle 92 equal to between about 68 degrees and about 92 degrees, and the third Euler angle 102 equal to between about zero degrees and about 360 degrees.

The first Lithium Niobate Thickness-Shear Mode Euler angle set includes the first Euler angle 82 equal to between about 170 degrees and about 190 degrees, the second Euler angle 92 equal to between about 90 degrees and about 110 degrees, and the third Euler angle 102 equal to between about zero degrees and about 360 degrees.

The second Lithium Niobate Thickness-Shear Mode Euler angle set includes the first Euler angle 82 equal to between about 290 degrees and about 310 degrees, the second Euler angle 92 equal to between about 90 degrees and about 110 degrees, and the third Euler angle 102 equal to between about zero degrees and about 360 degrees.

The third Lithium Niobate Thickness-Shear Mode Euler angle set includes the first Euler angle 82 equal to between about 50 degrees and about 70 degrees, the second Euler angle 92 equal to between about 90 degrees and about 110 degrees, and the third Euler angle 102 equal to between about zero degrees and about 360 degrees.

The fourth Lithium Niobate Thickness-Shear Mode Euler angle set includes the first Euler angle 82 equal to between about −10 degrees and about 10 degrees, the second Euler angle 92 equal to between about 70 degrees and about 90 degrees, and the third Euler angle 102 equal to between about zero degrees and about 360 degrees.

The fifth Lithium Niobate Thickness-Shear Mode Euler angle set includes the first Euler angle 82 equal to between about 110 degrees and about 130 degrees, the second Euler angle 92 equal to between about 70 degrees and about 90 degrees, and the third Euler angle 102 equal to between about zero degrees and about 360 degrees.

The sixth Lithium Niobate Thickness-Shear Mode Euler angle set includes the first Euler angle 82 equal to between about 230 degrees and about 250 degrees, the second Euler angle 92 equal to between about 70 degrees and about 90 degrees, and the third Euler angle 102 equal to between about zero degrees and about 360 degrees.

In one embodiment of the present invention, the MEMS vibrating structure 10 includes the thickness-shear mode of vibration, the single-crystal piezoelectric thin-film layer 12 includes Lithium Tantalate, and non-standard orientations of the uniform crystalline structure of the single-crystal piezoelectric thin-film layer 12 relative to the MEMS vibrating structures 10 include the first, second, third, fourth, fifth, and sixth Lithium Tantalate Thickness-Shear Mode orientations.

In an alternate embodiment of the present invention, the MEMS vibrating structure 10 includes the thickness-shear mode of vibration, the single-crystal piezoelectric thin-film layer 12 includes Lithium Niobate, and non-standard orientations of the uniform crystalline structure of the single-crystal piezoelectric thin-film layer 12 relative to the MEMS vibrating structures 10 include the first, second, third, fourth, fifth, and sixth Lithium Niobate Thickness-Shear Mode orientations.

An application example of the MEMS vibrating structure 10 is its use in filtering 104 in a mobile terminal 106, the basic architecture of which is represented in FIG. 12. The mobile terminal 106 may include a receiver front end 108, a radio frequency transmitter section 110, an antenna 112, a duplexer or switch 114, a baseband processor 116, a control system 118, a frequency synthesizer 120, and an interface 122. The receiver front end 108 receives information bearing radio frequency signals from one or more remote transmitters provided by a base station (not shown). A low noise amplifier (LNA) 124 amplifies the signal. The filtering 104 minimizes broadband interference in the received signal, while down conversion and digitization circuitry 126 down converts the filtered, received signal to an intermediate or baseband frequency signal, which is then digitized into one or more digital streams. The receiver front end 108 typically uses one or more mixing frequencies generated by the frequency synthesizer 120. The baseband processor 116 processes the digitized received signal to extract the information or data bits conveyed in the received signal. This processing typically comprises demodulation, decoding, and error correction operations. As such, the baseband processor 116 is generally implemented in one or more digital signal processors (DSPs).

On the transmit side, the baseband processor 116 receives digitized data, which may represent voice, data, or control information, from the control system 118, which it encodes for transmission. The encoded data is output to the transmitter 110, where it is used by a modulator 128 to modulate a carrier signal that is at a desired transmit frequency. Power amplifier circuitry 130 amplifies the modulated carrier signal to a level appropriate for transmission, and delivers the amplified and modulated carrier signal to the antenna 112 through the duplexer or switch 114.

A user may interact with the mobile terminal 106 via the interface 122, which may include interface circuitry 132 associated with a microphone 134, a speaker 136, a keypad 138, and a display 140. The interface circuitry 132 typically includes analog-to-digital converters, digital-to-analog converters, amplifiers, and the like. Additionally, it may include a voice encoder/decoder, in which case it may communicate directly with the baseband processor 116. The microphone 134 will typically convert audio input, such as the user's voice, into an electrical signal, which is then digitized and passed directly or indirectly to the baseband processor 116. Audio information encoded in the received signal is recovered by the baseband processor 116, and converted by the interface circuitry 132 into an analog signal suitable for driving the speaker 136. The keypad 138 and the display 140 enable the user to interact with the mobile terminal 106, input numbers to be dialed, address book information, or the like, as well as monitor call progress information.

Those skilled in the art will recognize improvements and modifications to the preferred embodiments of the present invention. All such improvements and modifications are considered within the scope of the concepts disclosed herein and the claims that follow.

What is claimed is:

1. A method for manufacturing a vibrating micro-electro-mechanical circuit comprising:
   providing a substrate having a substrate surface;
   forming at least one anchor on the substrate surface;
   forming a single conducting layer over the substrate surface;
   selecting a substantially uniform crystalline orientation of a single-crystal piezoelectric thin-film to provide at least one defined characteristic of the vibrating micro-electro-mechanical circuit; and
   forming a micro-electro-mechanical systems (MEMS) vibrating structure comprising:
     a body suspended from the at least one anchor and comprising:
       a first surface and a second surface that are about parallel to the substrate surface; and
       the single-crystal piezoelectric thin-film having the substantially uniform crystalline orientation relative to the first surface and the at least one anchor;
     a first conducting section residing on the first surface of the body and made from the single conducting layer; and
     a second conducting section residing on the second surface of the body and made from the single conducting layer, such that the MEMS vibrating structure has vibrations when a first electrical signal is applied to the first conducting section and the second conducting section.

2. The method for manufacturing the vibrating micro-electro-mechanical circuit of claim 1 wherein the at least one defined characteristic comprises a substantially maximized coupling coefficient of the MEMS vibrating structure.

3. The method for manufacturing the vibrating micro-electro-mechanical circuit of claim 1 wherein the at least one defined characteristic comprises a coupling coefficient of the MEMS vibrating structure above a first threshold.

4. The method for manufacturing the vibrating micro-electro-mechanical circuit of claim 1 wherein the at least one defined characteristic comprises a substantially minimized temperature coefficient of frequency of the MEMS vibrating structure.

5. The method for manufacturing the vibrating micro-electro-mechanical circuit of claim 1 wherein the at least one defined characteristic comprises a temperature coefficient of frequency of the MEMS vibrating structure below a first threshold.

6. The method for manufacturing the vibrating micro-electro-mechanical circuit of claim 1 wherein the at least one defined characteristic comprises a coupling coefficient of the MEMS vibrating structure that provides a bandwidth of the MEMS vibrating structure above a first threshold.

7. The method for manufacturing the vibrating micro-electro-mechanical circuit of claim 6 wherein the at least one defined characteristic further comprise a substantially minimized temperature coefficient of frequency of the MEMS vibrating structure.

8. The method for manufacturing the vibrating micro-electro-mechanical circuit of claim 7 wherein the vibrations comprise dominant lateral vibrations that are about parallel to the substrate surface.

9. The method for manufacturing the vibrating micro-electro-mechanical circuit of claim 1 wherein the single-crystal piezoelectric thin-film comprises Lithium Tantalate.

10. The method for manufacturing the vibrating micro-electro-mechanical circuit of claim 1 wherein the single-crystal piezoelectric thin-film comprises Lithium Niobate.

11. The method for manufacturing the vibrating micro-electro-mechanical circuit of claim 1 wherein the MEMS vibrating structure is configured to vibrate, such that a dominant mode of vibration of the MEMS vibrating structure comprises one of an inter-digital-transduced mode, a periodically-poled-transduced mode, and a width-extensional mode.

12. A method for manufacturing a vibrating micro-electro-mechanical circuit comprising:
  providing a substrate having a substrate surface;
  forming at least one anchor on the substrate surface;
  selecting a substantially uniform crystalline orientation of a single-crystal piezoelectric thin-film to provide at least one defined characteristic of the vibrating micro-electro-mechanical circuit; and
  forming a micro-electro-mechanical systems (MEMS) vibrating structure comprising:
    a body suspended from the at least one anchor and comprising:
      a first surface and a second surface that are about parallel to the substrate surface; and
      the single-crystal piezoelectric thin-film having the substantially uniform crystalline orientation relative to the first surface and the at least one anchor;
    a first conducting section residing on the first surface of the body; and
    a second conducting section residing on the second surface of the body, such that the MEMS vibrating structure has vibrations when a first electrical signal is applied to the first conducting section and the second conducting section;
  wherein the MEMS vibrating structure is configured to vibrate, such that a dominant mode of vibration of the MEMS vibrating structure is a contour mode of vibration, wherein an outer diameter of the MEMS vibrating structure varies as the MEMS vibrating structure vibrates.

13. A method for manufacturing a vibrating micro-electro-mechanical circuit comprising:
  providing a substrate having a substrate surface;
  forming at least one anchor on the substrate surface;
  selecting a substantially uniform crystalline orientation of a single-crystal piezoelectric thin-film to provide at least one defined characteristic of the vibrating micro-electro-mechanical circuit; and
  forming a micro-electro-mechanical systems (MEMS) vibrating structure comprising:
    a body suspended from the at least one anchor and comprising:
      a first surface and a second surface that are about parallel to the substrate surface; and
      the single-crystal piezoelectric thin-film having the substantially uniform crystalline orientation relative to the first surface and the at least one anchor;
    a first conducting section residing on the first surface of the body; and
    a second conducting section residing on the second surface of the body, such that the MEMS vibrating structure has vibrations when a first electrical signal is applied to the first conducting section and the second conducting section,
  wherein the MEMS vibrating structure is configured to vibrate, such that a dominant mode of vibration of the MEMS vibrating structure is a contour mode of vibration, wherein an outer diameter of the MEMS vibrating structure and an inner diameter of the MEMS vibrating structure vary as the MEMS vibrating structure vibrates.

14. A method for manufacturing a vibrating micro-electro-mechanical circuit comprising:
  providing a substrate having a substrate surface;
  forming at least one anchor on the substrate surface;
  selecting a substantially uniform crystalline orientation of a single-crystal piezoelectric thin-film to provide at least one defined characteristic of the vibrating micro-electro-mechanical circuit; and
  forming a micro-electro-mechanical systems (MEMS) vibrating structure comprising:
    a body suspended from the at least one anchor and comprising:
      a first surface and a second surface that are about parallel to the substrate surface; and
      the single-crystal piezoelectric thin-film having the substantially uniform crystalline orientation relative to the first surface and the at least one anchor;
    a first conducting section residing on the first surface of the body; and
    a second conducting section residing on the second surface of the body, such that the MEMS vibrating structure has vibrations when a first electrical signal is applied to the first conducting section and the second conducting section,
  wherein the MEMS vibrating structure is configured to vibrate, such that a dominant mode of vibration of the MEMS vibrating structure is a thickness-shear mode of vibration, wherein as the MEMS vibrating structure vibrates, a top of the single-crystal piezoelectric thin-film moves laterally in one direction, while a bottom of the single-crystal piezoelectric thin-film layer moves in about an opposite direction.

15. A method for manufacturing a vibrating micro-electro-mechanical circuit comprising:
  providing a substrate having a substrate surface;
  forming at least one anchor on the substrate surface;
  selecting a substantially uniform crystalline orientation of a single-crystal piezoelectric thin-film to provide at least one defined characteristic of the vibrating micro-electro-mechanical circuit; and
  forming a micro-electro-mechanical systems (MEMS) vibrating structure comprising:
    a body suspended from the at least one anchor and comprising:
      a first surface and a second surface that are about parallel to the substrate surface; and
      the single-crystal piezoelectric thin-film having the substantially uniform crystalline orientation relative to the first surface and the at least one anchor;

a first conducting section residing on the first surface of the body; and a second conducting section residing on the second surface of the body, such that the MEMS vibrating structure has vibrations when a first electrical signal is applied to the first conducting section and the second conducting section, wherein the MEMS vibrating structure is configured to vibrate, such that a dominant mode of vibration of the MEMS vibrating structure is a thickness-extensional mode of vibration, wherein a thickness of the MEMS vibrating structure varies as the MEMS vibrating structure vibrates.

16. A method for manufacturing a vibrating micro-electro-mechanical circuit comprising:

providing a substrate having a substrate surface;

forming at least one anchor on the substrate surface;

selecting a substantially uniform crystalline orientation of a single-crystal piezoelectric thin-film to provide at least one defined characteristic of the vibrating micro-electro-mechanical circuit; and forming a micro-electro-mechanical systems (MEMS) vibrating structure comprising:

a body suspended from the at least one anchor and comprising:

a first surface and a second surface that are about parallel to the substrate surface; and the single-crystal piezoelectric thin-film having the substantially uniform crystalline orientation relative to the first surface and the at least one anchor;

a first conducting section residing on the first surface of the body; and a second conducting section residing on the second surface of the body, such that the MEMS vibrating structure has vibrations when a first electrical signal is applied to the first conducting section and the second conducting section, wherein:

the single-crystal piezoelectric thin-film comprises Lithium Tantalate;

the body has:

a length that is about parallel to the first surface;

a width that is about parallel to the first surface and is about perpendicular to the length; and a thickness that is about perpendicular to the first surface, wherein the substantially uniform crystalline orientation relative to the first surface and the body is represented with a translation between a Cartesian Coordinate System and a third translated Cartesian Coordinate System, such that:

a uniform crystalline structure of the single-crystal piezoelectric thin-film is about aligned with an x-axis, a y-axis, and a z-axis of the Cartesian Coordinate System;

before translation, the x-axis is about parallel with the width, the y-axis is about parallel with the length, and the z-axis is about parallel with the thickness;

a translation from the Cartesian Coordinate System to a first translated Cartesian Coordinate System is based on keeping the z-axis stationary, and forming a first translated x-axis, a first translated y-axis, and a first translated z-axis by rotating the x-axis toward the y-axis, such that a first angle is formed between the x-axis and the first translated x-axis;

the first translated x-axis, the first translated y-axis, and the first translated z-axis are perpendicular to one another;

a translation from the first translated Cartesian Coordinate System to a second translated Cartesian Coordinate System is based on keeping the first translated x-axis stationary, and forming a second translated x-axis, a second translated y-axis, and a second translated z-axis by rotating the first translated z-axis away from the first translated y-axis, such that a second angle is formed between the first translated z-axis and the second translated z-axis;

the second translated x-axis, the second translated y-axis, and the second translated z-axis are perpendicular to one another;

a translation from the second translated Cartesian Coordinate System to the third translated Cartesian Coordinate System is based on keeping the second translated z-axis stationary, and forming a third translated x-axis, a third translated y-axis, and a third translated z-axis by rotating the second translated x-axis toward the second translated y-axis, such that a third angle is formed between the third translated x-axis and the second translated x-axis;

the third translated x-axis, the third translated y-axis, and the third translated z-axis are perpendicular to one another, and the first angle, the second angle, and the third angle form an angle set; and the angle set comprises one of a first set, a second set, a third set, a fourth set, a fifth set, a sixth set, a seventh set, an eighth set, a ninth set, a tenth set, an eleventh set, and a twelfth set, such that:

the first set comprises the first angle equal to between about −10 degrees and about 10 degrees, the second angle equal to between about 25 degrees and about 55 degrees, and the third angle equal to between about 80 degrees and about 100 degrees;

the second set comprises the first angle equal to between about 170 degrees and about 190 degrees, the second angle equal to between about 115 degrees and about 145 degrees, and the third angle equal to between about 80 degrees and about 100 degrees;

the third set comprises the first angle equal to between about −10 degrees and about 10 degrees, the second angle equal to between about 25 degrees and about 55 degrees, and the third angle equal to between about 260 degrees and about 280 degrees;

the fourth set comprises the first angle equal to between about 170 degrees and about 190 degrees, the second angle equal to between about 115 degrees and about 145 degrees, and the third angle equal to between about 260 degrees and about 280 degrees;

the fifth set comprises the first angle equal to between about 110 degrees and about 130 degrees, the second angle equal to between about 25 degrees and about 55 degrees, and the third angle equal to between about 80 degrees and about 100 degrees;

the sixth set comprises the first angle equal to between about 290 degrees and about 310 degrees, the second angle equal to between about 115 degrees and about 145 degrees, and the third angle equal to between about 80 degrees and about 100 degrees;

the seventh set comprises the first angle equal to between about 110 degrees and about 130 degrees, the second angle equal to between about 25 degrees and about 55 degrees, and the third angle equal to between about 260 degrees and about 280 degrees;

the eighth set comprises the first angle equal to between about 290 degrees and about 310 degrees, the second angle equal to between about 115 degrees and about 145 degrees, and the third angle equal to between about 260 degrees and about 280 degrees;

the ninth set comprises the first angle equal to between about 230 degrees and about 250 degrees, the second angle equal to between about 25 degrees and about 55 degrees, and the third angle equal to between about 80 degrees and about 100 degrees;

the tenth set comprises the first angle equal to between about 50 degrees and about 70 degrees, the second angle equal to between about 115 degrees and about 145 degrees, and the third angle equal to between about 80 degrees and about 100 degrees;

the eleventh set comprises the first angle equal to between about 230 degrees and about 250 degrees, the second angle equal to between about 25 degrees and about 55 degrees, and the third angle equal to between about 260 degrees and about 280 degrees; and the twelfth set comprises the first angle equal to between about 50 degrees and about 70 degrees, the second angle equal to between about 115 degrees and about 145 degrees, and the third angle equal to between about 260 degrees and about 280 degrees.

17. A method for manufacturing a vibrating micro-electromechanical circuit comprising:
    providing a substrate having a substrate surface;
    forming at least one anchor on the substrate surface;
    selecting a substantially uniform crystalline orientation of a single-crystal piezoelectric thin-film to provide at least one defined characteristic of the vibrating micro-electromechanical circuit; and
    forming a micro-electro-mechanical systems (MEMS) vibrating structure comprising:
        a body suspended from the at least one anchor and comprising:
            a first surface and a second surface that are about parallel to the substrate surface; and
            the single-crystal piezoelectric thin-film having the substantially uniform crystalline orientation relative to the first surface and the at least one anchor;
        a first conducting section residing on the first surface of the body; and
        a second conducting section residing on the second surface of the body, such that the MEMS vibrating structure has vibrations when a first electrical signal is applied to the first conducting section and the second conducting section,
    wherein:
    the single-crystal piezoelectric thin-film comprises Lithium Niobate;
    the body has:
        a length that is about parallel to the first surface;
        a width that is about parallel to the first surface and is about perpendicular to the length; and
        a thickness that is about perpendicular to the first surface,
    wherein the substantially uniform crystalline orientation relative to the first surface and the body is represented with a translation between a Cartesian Coordinate System and a third translated Cartesian Coordinate System, such that:
    a uniform crystalline structure of the single-crystal piezoelectric thin-film is about aligned with an x-axis, a y-axis, and a z-axis of the Cartesian Coordinate System;
    before translation, the x-axis is about parallel with the width, the y-axis is about parallel with the length, and the z-axis is about parallel with the thickness;
    a translation from the Cartesian Coordinate System to a first translated Cartesian Coordinate System is based on keeping the z-axis stationary, and forming a first translated x-axis, a first translated y-axis, and a first translated z-axis by rotating the x-axis toward the y-axis, such that a first angle is formed between the x-axis and the first translated x-axis;
    the first translated x-axis, the first translated y-axis, and the first translated z-axis are perpendicular to one another;
    a translation from the first translated Cartesian Coordinate System to a second translated Cartesian Coordinate System is based on keeping the first translated x-axis stationary, and forming a second translated x-axis, a second translated y-axis, and a second translated z-axis by rotating the first translated z-axis away from the first translated y-axis, such that a second angle is formed between the first translated z-axis and the second translated z-axis;
    the second translated x-axis, the second translated y-axis, and the second translated z-axis are perpendicular to one another;
    a translation from the second translated Cartesian Coordinate System to the third translated Cartesian Coordinate System is based on keeping the second translated z-axis stationary, and forming a third translated x-axis, a third translated y-axis, and a third translated z-axis by rotating the second translated x-axis toward the second translated y-axis, such that a third angle is formed between the third translated x-axis and the second translated x-axis;
    the third translated x-axis, the third translated y-axis, and the third translated z-axis are perpendicular to one another, and the first angle, the second angle, and the third angle form an angle set; and
    the angle set comprises one of a first set, a second set, a third set, a fourth set, a fifth set, a sixth set, a seventh set, an eighth set, a ninth set, a tenth set, an eleventh set, and a twelfth set, such that:
        the first set comprises the first angle equal to between about −10 degrees and about 10 degrees, the second angle equal to between about 30 degrees and about 60 degrees, and the third angle equal to between about 80 degrees and about 100 degrees;
        the second set comprises the first angle equal to between about 170 degrees and about 190 degrees, the second angle equal to between about 120 degrees and about 150 degrees, and the third angle equal to between about 80 degrees and about 100 degrees;
        the third set comprises the first angle equal to between about −10 degrees and about 10 degrees, the second angle equal to between about 30 degrees and about 60 degrees, and the third angle equal to between about 260 degrees and about 280 degrees;
        the fourth set comprises the first angle equal to between about 170 degrees and about 190 degrees, the second angle equal to between about 120 degrees and about 150 degrees, and the third angle equal to between about 260 degrees and about 280 degrees;
        the fifth set comprises the first angle equal to between about 110 degrees and about 130 degrees, the second angle equal to between about 30 degrees and about 60 degrees, and the third angle equal to between about 80 degrees and about 100 degrees;
        the sixth set comprises the first angle equal to between about 290 degrees and about 310 degrees, the second angle equal to between about 120 degrees and about 150 degrees, and the third angle equal to between about 80 degrees and about 100 degrees;
        the seventh set comprises the first angle equal to between about 110 degrees and about 130 degrees, the second angle equal to between about 30 degrees and about 60 degrees, and the third angle equal to between about 260 degrees and about 280 degrees;

the eighth set comprises the first angle equal to between about 290 degrees and about 310 degrees, the second angle equal to between about 120 degrees and about 150 degrees, and the third angle equal to between about 260 degrees and about 280 degrees;

the ninth set comprises the first angle equal to between about 230 degrees and about 250 degrees, the second angle equal to between about 30 degrees and about 60 degrees, and the third angle equal to between about 80 degrees and about 100 degrees;

the tenth set comprises the first angle equal to between about 50 degrees and about 70 degrees, the second angle equal to between about 120 degrees and about 150 degrees, and the third angle equal to between about 80 degrees and about 100 degrees;

the eleventh set comprises the first angle equal to between about 230 degrees and about 250 degrees, the second angle equal to between about 30 degrees and about 60 degrees, and the third angle equal to between about 260 degrees and about 280 degrees; and the twelfth set comprises the first angle equal to between about 50 degrees and about 70 degrees, the second angle equal to between about 120 degrees and about 150 degrees, and the third angle equal to between about 260 degrees and about 280 degrees.

18. A method for manufacturing a vibrating micro-electro-mechanical circuit comprising:

providing a substrate having a substrate surface;

forming at least one anchor on the substrate surface;

selecting a substantially uniform crystalline orientation of a single-crystal piezoelectric thin-film to provide at least one defined characteristic of the vibrating micro-electro-mechanical circuit; and forming a micro-electro-mechanical systems (MEMS) vibrating structure comprising:
 a body suspended from the at least one anchor and comprising:
  a first surface and a second surface that are about parallel to the substrate surface; and
  the single-crystal piezoelectric thin-film having the substantially uniform crystalline orientation relative to the first surface and the at least one anchor;
 a first conducting section residing on the first surface of the body; and
 a second conducting section residing on the second surface of the body, such that the MEMS vibrating structure has vibrations when a first electrical signal is applied to the first conducting section and the second conducting section, wherein:

the single-crystal piezoelectric thin-film comprises Lithium Tantalate;

the body has:
 a length that is about parallel to the first surface;
 a width that is about parallel to the first surface and is about perpendicular to the length; and
 a thickness that is about perpendicular to the first surface, wherein the substantially uniform crystalline orientation relative to the first surface and the body is represented with a translation between a Cartesian Coordinate System and a third translated Cartesian Coordinate System, such that:

a uniform crystalline structure of the single-crystal piezoelectric thin-film is about aligned with an x-axis, a y-axis, and a z-axis of the Cartesian Coordinate System;

before translation, the x-axis is about parallel with the length, the y-axis is about parallel with the width, and the z-axis is about parallel with the thickness;

a translation from the Cartesian Coordinate System to a first translated Cartesian Coordinate System is based on keeping the z-axis stationary, and forming a first translated x-axis, a first translated y-axis, and a first translated z-axis by rotating the x-axis toward the y-axis, such that a first angle is formed between the x-axis and the first translated x-axis;

the first translated x-axis, the first translated y-axis, and the first translated z-axis are perpendicular to one another;

a translation from the first translated Cartesian Coordinate System to a second translated Cartesian Coordinate System is based on keeping the first translated x-axis stationary, and forming a second translated x-axis, a second translated y-axis, and a second translated z-axis by rotating the first translated z-axis away from the first translated y-axis, such that a second angle is formed between the first translated z-axis and the second translated z-axis;

the second translated x-axis, the second translated y-axis, and the second translated z-axis are perpendicular to one another;

a translation from the second translated Cartesian Coordinate System to the third translated Cartesian Coordinate System is based on keeping the second translated z-axis stationary, and forming a third translated x-axis, a third translated y-axis, and a third translated z-axis by rotating the second translated x-axis toward the second translated y-axis, such that a third angle is formed between the third translated x-axis and the second translated x-axis;

the third translated x-axis, the third translated y-axis, and the third translated z-axis are perpendicular to one another, and the first angle, the second angle, and the third angle form an angle set; and the angle set comprises one of a first set, a second set, a third set, a fourth set, a fifth set, and a sixth set, such that:
 the first set comprises the first angle equal to between about −10 degrees and about 10 degrees, the second angle equal to between about 102 degrees and about 148 degrees, and the third angle equal to between about zero degrees and about 360 degrees;
 the second set comprises the first angle equal to between about 170 degrees and about 190 degrees, the second angle equal to between about 54 degrees and about 100 degrees, and the third angle equal to between about zero degrees and about 360 degrees;
 the third set comprises the first angle equal to between about 110 degrees and about 130 degrees, the second angle equal to between about 102 degrees and about 148 degrees, and the third angle equal to between about zero degrees and about 360 degrees;
 the fourth set comprises the first angle equal to between about 290 degrees and about 310 degrees, the second angle equal to between about 54 degrees and about 100 degrees, and the third angle equal to between about zero degrees and about 360 degrees;
 the fifth set comprises the first angle equal to between about 230 degrees and about 250 degrees, the second angle equal to between about 102 degrees and about 148 degrees, and the third angle equal to between about zero degrees and about 360 degrees; and the sixth set comprises the first angle equal to between about 50 degrees and about 70 degrees, the second angle equal to between about 54 degrees and about 100 degrees, and the third angle equal to between about zero degrees and about 360 degrees.

19. A method for manufacturing a vibrating micro-electromechanical circuit comprising:
providing a substrate having a substrate surface;
forming at least one anchor on the substrate surface;
selecting a substantially uniform crystalline orientation of a single-crystal piezoelectric thin-film to provide at least one defined characteristic of the vibrating micro-electromechanical circuit;
forming a micro-electro-mechanical systems (MEMS) vibrating structure comprising:
  a body suspended from the at least one anchor and comprising:
    a first surface and a second surface that are about parallel to the substrate surface; and
    the single-crystal piezoelectric thin-film having the substantially uniform crystalline orientation relative to the first surface and the at least one anchor;
  a first conducting section residing on the first surface of the body; and
  a second conducting section residing on the second surface of the body, such that the MEMS vibrating structure has vibrations when a first electrical signal is applied to the first conducting section and the second conducting section, wherein:
the single-crystal piezoelectric thin-film comprises Lithium Niobate;
the body has:
  a length that is about parallel to the first surface;
  a width that is about parallel to the first surface and is about perpendicular to the length; and
  a thickness that is about perpendicular to the first surface,
wherein the substantially uniform crystalline orientation relative to the first surface and the body is represented with a translation between a Cartesian Coordinate System and a third translated Cartesian Coordinate System, such that:
a uniform crystalline structure of the single-crystal piezoelectric thin-film is about aligned with an x-axis, a y-axis, and a z-axis of the Cartesian Coordinate System;
before translation, the x-axis is about parallel with the length, the y-axis is about parallel with the width, and the z-axis is about parallel with the thickness;
a translation from the Cartesian Coordinate System to a first translated Cartesian Coordinate System is based on keeping the z-axis stationary, and forming a first translated x-axis, a first translated y-axis, and a first translated z-axis by rotating the x-axis toward the y-axis, such that a first angle is formed between the x-axis and the first translated x-axis;
the first translated x-axis, the first translated y-axis, and the first translated z-axis are perpendicular to one another;
a translation from the first translated Cartesian Coordinate System to a second translated Cartesian Coordinate System is based on keeping the first translated x-axis stationary, and forming a second translated x-axis, a second translated y-axis, and a second translated z-axis by rotating the first translated z-axis away from the first translated y-axis, such that a second angle is formed between the first translated z-axis and the second translated z-axis;
the second translated x-axis, the second translated y-axis, and the second translated z-axis are perpendicular to one another;
a translation from the second translated Cartesian Coordinate System to the third translated Cartesian Coordinate System is based on keeping the second translated z-axis stationary, and forming a third translated x-axis, a third translated y-axis, and a third translated z-axis by rotating the second translated x-axis toward the second translated y-axis, such that a third angle is formed between the third translated x-axis and the second translated x-axis;
the third translated x-axis, the third translated y-axis, and the third translated z-axis are perpendicular to one another, and the first angle, the second angle, and the third angle form an angle set; and
the angle set comprises one of a first set, a second set, a third set, a fourth set, a fifth set, and a sixth set, such that:
  the first set comprises the first angle equal to between about −10 degrees and about 10 degrees, the second angle equal to between about 106 degrees and about 139 degrees, and the third angle equal to between about zero degrees and about 360 degrees;
  the second set comprises the first angle equal to between about 170 degrees and about 190 degrees, the second angle equal to between about 42 degrees and about 75 degrees, and the third angle equal to between about zero degrees and about 360 degrees;
  the third set comprises the first angle equal to between about 110 degrees and about 130 degrees, the second angle equal to between about 106 degrees and about 139 degrees, and the third angle equal to between about zero degrees and about 360 degrees;
  the fourth set comprises the first angle equal to between about 290 degrees and about 310 degrees, the second angle equal to between about 42 degrees and about 75 degrees, and the third angle equal to between about zero degrees and about 360 degrees;
  the fifth set comprises the first angle equal to between about 230 degrees and about 250 degrees, the second angle equal to between about 106 degrees and about 139 degrees, and the third angle equal to between about zero degrees and about 360 degrees; and
  the sixth set comprises the first angle equal to between about 50 degrees and about 70 degrees, the second angle equal to between about 42 degrees and about 75 degrees, and the third angle equal to between about zero degrees and about 360 degrees.

* * * * *